(12) United States Patent
Hahto et al.

(10) Patent No.: US 9,502,213 B2
(45) Date of Patent: Nov. 22, 2016

(54) ION BEAM LINE

(71) Applicant: Nissin Ion Equipment Co., Ltd., Kyoto-shi, Kyoto (JP)

(72) Inventors: Sami K. Hahto, Nashua, NH (US); Tetsuro Yamamoto, Billerica, MA (US)

(73) Assignee: Nissin Ion Equipment Co., Ltd., Kyoto (JP)

( * ) Notice: Subject to any disclaimer, the term of this patent is extended or adjusted under 35 U.S.C. 154(b) by 0 days.

(21) Appl. No.: 14/831,225

(22) Filed: Aug. 20, 2015

(65) Prior Publication Data

US 2016/0005570 A1 Jan. 7, 2016

Related U.S. Application Data

(63) Continuation-in-part of application No. 13/833,668, filed on Mar. 15, 2013, now Pat. No. 9,142,386.

(51) Int. Cl.
*H01J 37/317* (2006.01)
*H01J 37/30* (2006.01)

(52) U.S. Cl.
CPC ........ *H01J 37/3171* (2013.01); *H01J 37/3007* (2013.01); *H01J 2237/047* (2013.01); *H01J 2237/04756* (2013.01); *H01J 2237/10* (2013.01); *H01J 2237/121* (2013.01); *H01J 2237/151* (2013.01); *H01J 2237/24542* (2013.01); *H01J 2237/30472* (2013.01)

(58) Field of Classification Search
CPC ............... H01J 37/3171; H01J 37/147; H01J 37/1477; H01J 37/3007; H01J 37/12; H01J 2237/24528; H01J 2237/151; H01J 2237/047; H01J 2237/12; H01J 2237/121; H01J 2237/04924; H01J 2237/31713
See application file for complete search history.

(56) References Cited

U.S. PATENT DOCUMENTS 5,091,655 A * 2/1992 Dykstra ................. H01J 37/12
250/398
5,126,575 A 6/1992 White
(Continued)

FOREIGN PATENT DOCUMENTS

JP 2005327713 11/2005
JP 2008047459 2/2008
JP 2011018578 A 1/2011

OTHER PUBLICATIONS

Inouchi, Proc. IIT, 2008, pp. 316-319.
(Continued)

*Primary Examiner* — Jack Berman
(74) *Attorney, Agent, or Firm* — Thomas J. Engellenner; Reza Mollaaghababa; Pepper Hamilton LLP

(57) ABSTRACT

In one aspect, an ion implantation system is disclosed, which comprises a deceleration system configured to receive an ion beam and decelerate the ion beam at a deceleration ratio of at least 2, and an electrostatic bend disposed downstream of the deceleration system for causing a deflection of the ion beam. The electrostatic bend includes three tandem electrode pairs for receiving the decelerated beam, where each electrode pair has an inner and an outer electrode spaced apart to allow passage of the ion beam therethrough. Each of the electrodes of the end electrode pair is held at an electric potential less than an electric potential at which any of the electrodes of the middle electrode pair is held and the electrodes of the first electrode pair are held at a lower electric potential relative to the electrodes of the middle electrode pair.

20 Claims, 23 Drawing Sheets

(56) References Cited

U.S. PATENT DOCUMENTS

| | | | | |
|---|---|---|---|---|
| 5,177,366 A * | | 1/1993 | King | H01J 37/3171 250/398 |
| 5,311,028 A | | 5/1994 | Glavish | |
| 5,350,926 A | | 9/1994 | White | |
| 5,497,006 A | | 3/1996 | Sferlazzo | |
| 5,703,372 A | | 12/1997 | Horsky | |
| 5,834,786 A | | 11/1998 | White | |
| 6,137,112 A | | 10/2000 | McIntyre et al. | |
| 6,259,210 B1 | | 7/2001 | Wells | |
| 6,521,895 B1 | | 2/2003 | Walther et al. | |
| 6,635,880 B1 | | 10/2003 | Renau | |
| 6,664,547 B2 | | 12/2003 | Benveniste | |
| 6,686,595 B2 | | 2/2004 | Horsky | |
| 6,744,214 B2 | | 6/2004 | Horsky | |
| 6,770,889 B2 | | 8/2004 | Iwasawa | |
| 6,777,686 B2 | | 8/2004 | Olson | |
| 7,064,491 B2 | | 6/2006 | Horsky | |
| 7,078,713 B2 | | 7/2006 | White | |
| 7,326,941 B2 | | 2/2008 | Chen | |
| 7,435,976 B2 * | | 10/2008 | Naito | H01J 37/05 250/492.21 |
| 7,635,850 B2 | | 12/2009 | Yamashita et al. | |
| 7,718,978 B2 | | 5/2010 | Yamashita | |
| 7,755,062 B2 | | 7/2010 | Yamashita | |
| 7,771,773 B2 | | 8/2010 | Namavar | |
| 7,791,041 B2 | | 9/2010 | Yamashita | |
| 7,989,784 B2 | | 8/2011 | Glavish | |
| 8,129,695 B2 | | 3/2012 | Kellerman | |
| 8,242,009 B2 | | 8/2012 | Wojtczuk | |
| 8,253,114 B2 | | 8/2012 | Yamashita | |
| 8,389,964 B2 * | | 3/2013 | Igo | H01J 37/147 250/396 R |
| 8,481,960 B2 | | 7/2013 | Radovanov et al. | |
| 9,142,386 B2 * | | 9/2015 | Hahto | H01J 37/3007 |
| 9,293,295 B2 * | | 3/2016 | Yagita | H01J 37/147 |
| 2003/0173914 A1 | | 9/2003 | Yamashita | |
| 2005/0253089 A1 | | 11/2005 | Maeno et al. | |
| 2005/0258380 A1 | | 11/2005 | White | |
| 2007/0089833 A1 | | 4/2007 | Inouchi | |
| 2009/0261248 A1 | | 10/2009 | Glavish | |
| 2010/0065761 A1 * | | 3/2010 | Graf | H01J 37/147 250/492.21 |
| 2010/0243879 A1 | | 9/2010 | Huang | |
| 2011/0297843 A1 | | 12/2011 | Igo | |
| 2013/0042809 A1 | | 2/2013 | Naito | |

OTHER PUBLICATIONS

Ikejiri, Proc. IIT, 2008, pp. 320-323.

* cited by examiner

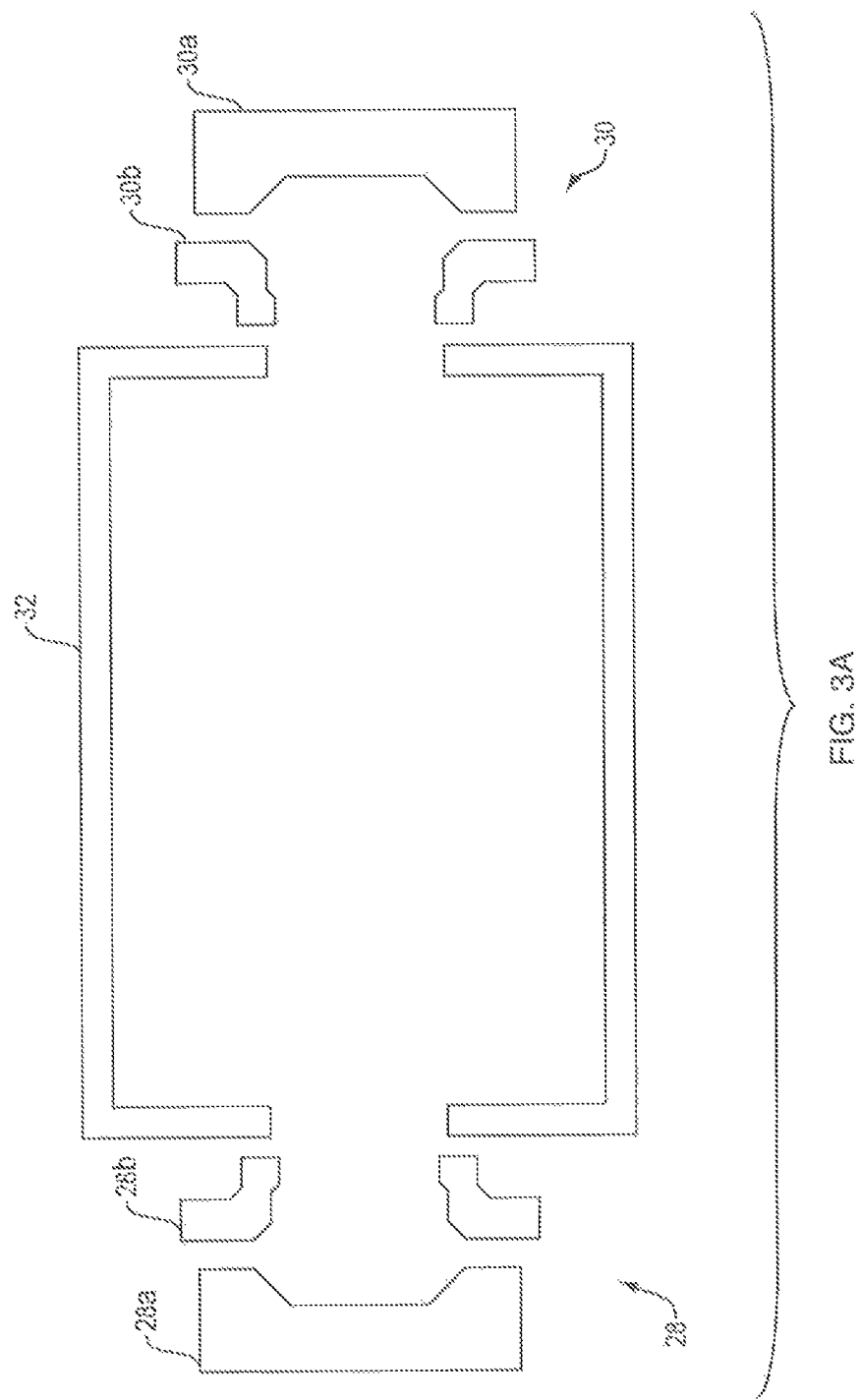

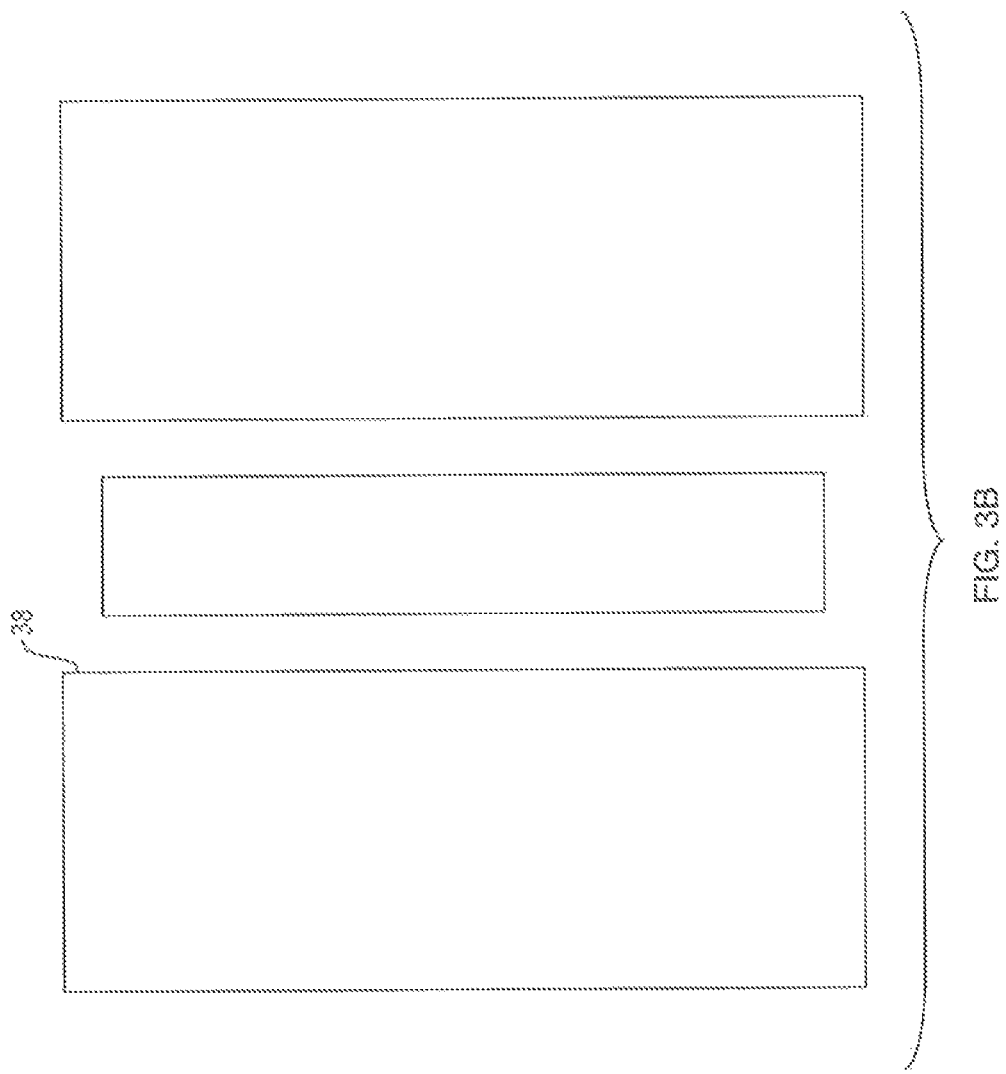

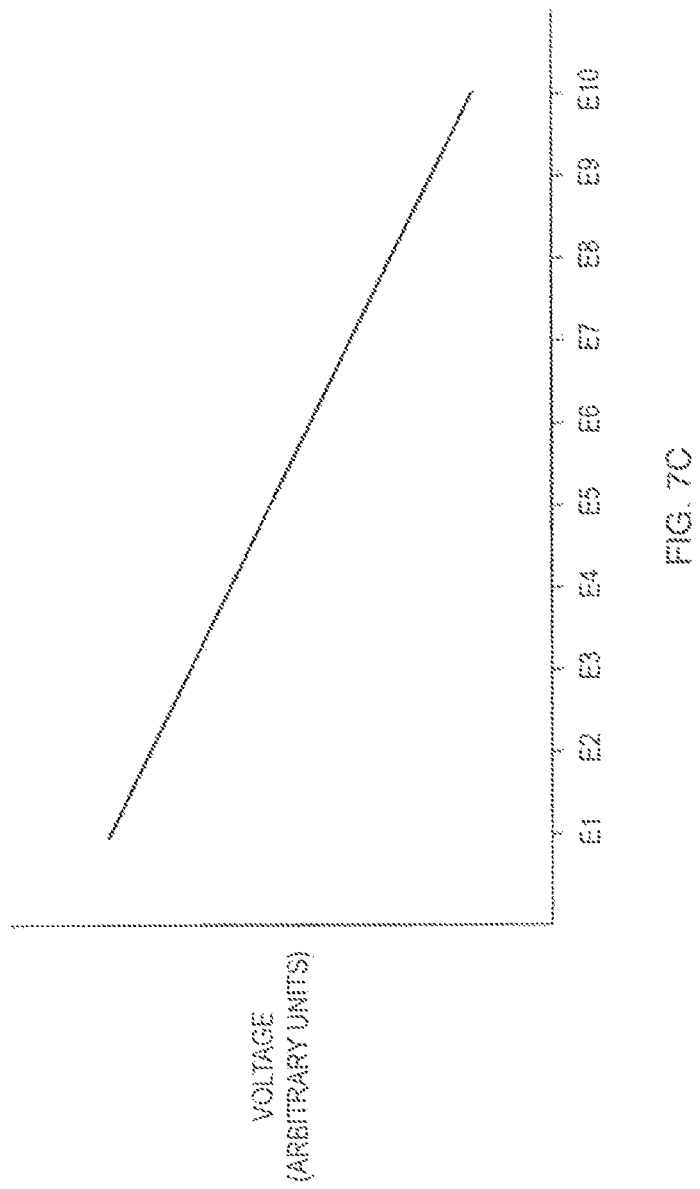

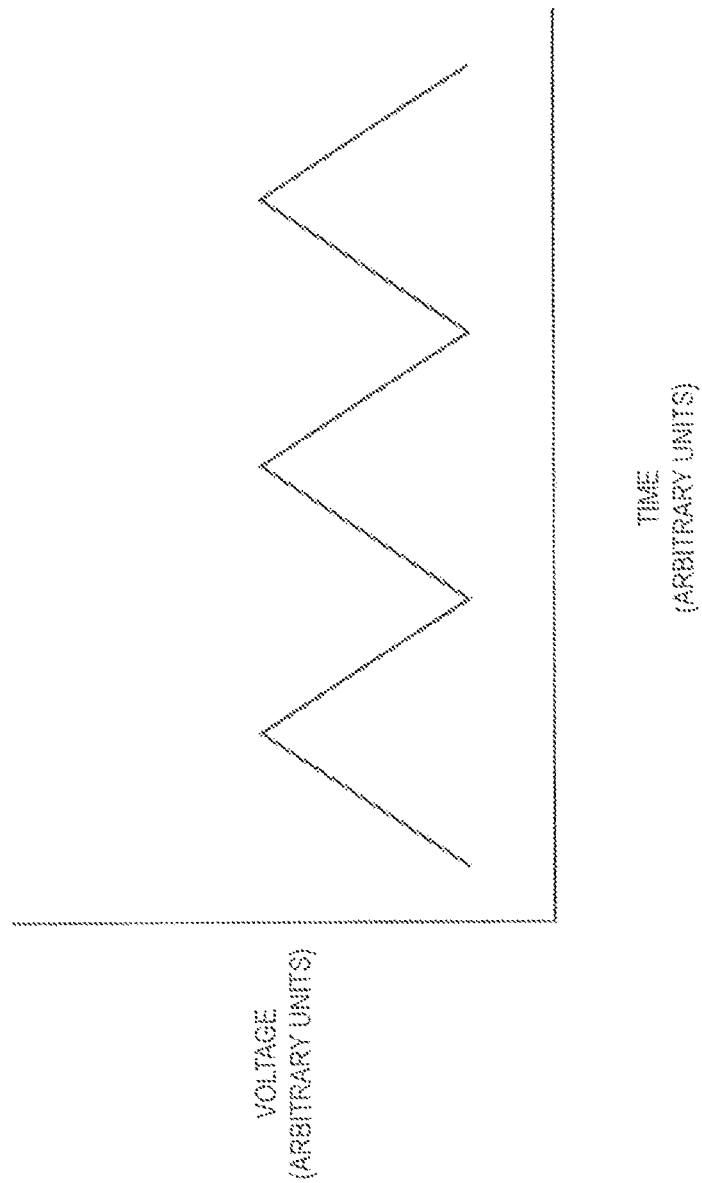

ION BEAM LINE

RELATED APPLICATION

The present application claims priority as a continuation-in-part application to an application entitled "Ion Beam Line," and having an application Ser. No. 13/833,668, which was filed on Mar. 15, 2013. This application is herein incorporated by reference in its entirety.

BACKGROUND

The present teachings relate generally to ion implantation systems and methods, including systems and methods for adjusting the current density of a ribbon ion beam to enhance its profile uniformity.

Ion implantation techniques have been employed for more than thirty years to implant ions in semiconductors for fabricating integrated circuits. Traditionally, three types of ion implanters are employed for such ion implantation: a medium-current, a high-current and a high-energy implanter. The ion sources incorporated in high current implanters typically include extraction apertures in the form of slots having high aspect ratios in order to ameliorate the effects of space charge. A one-dimensional ion beam extracted from such an ion source can be focused into an elliptical profile to produce a substantially round beam profile at a wafer on which the beam is incident.

Some recent commercial high-current ion implanters impinge a so-called ribbon ion beam, which exhibits a nominally one-dimensional profile, onto a wafer to implant ions therein. The use of such a ribbon ion beam offers several advantages for wafer processing. For example, the ribbon ion beam can have a long dimension exceeding the wafer's diameter and hence can be held stationary as the wafer is scanned only in one dimension orthogonal to the propagation direction of the ion beam to implant ions across the entire wafer. Further, a ribbon ion beam can allow for a higher current at the wafer.

The use of a ribbon ion beam for ion implantation poses, however, a number of challenges. By way of example, a high uniformity of the longitudinal profile of the ion beam is required to obtain an acceptable dose uniformity of the implanted ions. As the wafer sizes increase (e.g., as the next generation 450-mm wafers replace the current predominantly 300-mm wafers), it becomes more challenging to achieve an acceptable longitudinal uniformity of a ribbon ion beam utilized for processing the wafers.

In some conventional ion implantation systems, corrector optics are incorporated into the ion beam line to alter the charge density of the ion beam during ion beam transport. This approach is not, however, generally capable of creating sufficient ion beam uniformity, if the ion beam profile exhibits high non-uniformity upon extraction from the ion source, or due to aberrations induced by space charge loading or by beam transport optics.

Accordingly, there is a need for enhanced ion implantation systems that solve the above shortcomings. In particular, there is a need for improved systems and methods for ion implantation, including enhanced systems and methods for generating ion beams with desired energies and a desired beam profile along the beam line.

SUMMARY

In one aspect, a system for changing an energy of a ribbon ion beam is disclosed, which comprises a corrector device configured to receive a ribbon ion beam and to adjust a current density profile of the ion beam along a longitudinal dimension thereof, at least one deceleration/acceleration element defining a deceleration/acceleration region for decelerating or accelerating the ion beam as the ion beam passes therethrough, a focusing lens for reducing divergence of the ion beam along a transverse dimension thereof, and an electrostatic bend disposed downstream of said deceleration/acceleration region to cause a deflection of the ion beam.

In some embodiments, the corrector device can include a plurality of spaced electrode pairs stacked along the longitudinal dimension of the ion beam with the electrodes of each pair spaced apart to form a gap for passage of the ion beam therethrough, wherein the electrode pairs are configured to be individually biasable by application of electrostatic voltages thereto for locally deflecting the ion beam along said longitudinal dimension. A variety of different electrode types can be employed. In some embodiments, the electrode pairs can include plate electrodes disposed substantially parallel or perpendicular to a plane formed by a propagation direction of the ion beam and a transverse dimension thereof. The system can further include at least one voltage source for applying said electrostatic voltages to said electrode pairs of the corrector device.

A controller in communication with said at least one voltage source can control the application of the electrostatic voltages to said electrode pairs. By way of example, the controller can be configured to instruct the voltage source to apply electrostatic voltages to the electrode pairs to locally deflect at least a portion of the ion beam so as to enhance the uniformity of the current density profile along the longitudinal dimension of the ion beam.

The controller can be configured to determine the electrostatic voltages for application to the electrode pairs of the corrector device based on a measured current density profile of the ion beam, e.g., after passing through the analyzer magnet or near the plane of a substrate on which the beam is incident.

In some embodiments, the controller is configured to apply temporally varying voltages to the electrode pairs of the corrector device. For example, the controller can be configured to temporally change electric voltages applied to the electrode pairs of the corrector device so as to cause oscillating motion of the ion beam along the longitudinal dimension. Such oscillating motion of the ion beam can exhibit, for example, an amplitude equal to or less than about 20 mm, e.g., in a range of about 10 mm to about 20 mm. By way of example, the frequency of the oscillation can be in a range of about 1 Hz to about 1 kHz.

The focusing lens can include at least one focusing element, e.g., a pair of opposed electrodes spaced to form a gap for receiving the ion beam. Further, the deceleration/acceleration element can include a pair of electrodes spaced to form a transverse gap for receiving the ion beam. The focusing element and the deceleration/acceleration element can be disposed relative to one another to form a gap therebetween and can be maintained at different electric potentials such that a passage of the ions through said gap causes deceleration or acceleration of the ions.

In some embodiments, at least one of the focusing electrodes can comprise a curved upstream end face configured to reduce divergence of the ion beam along its longitudinal dimension. For example, the upstream end face of the focusing electrode can be concave with a radius of curvature in a range of about 1 m to about 10 m.

In some embodiments, the at least one deceleration/acceleration element is disposed downstream of said corrector device and said at least one focusing element is disposed downstream of the deceleration/acceleration element.

The focusing element can be disposed relative to the electrostatic bend to form a gap therewith, wherein said focusing element and the electrostatic bend are held at different electric potentials to generate an electric field in the gap adapted to reduce divergence of the ion beam along said transverse dimension.

In some embodiments, the electrostatic bend comprises an inner electrode and an opposed outer electrode held at different electric potentials so as to cause a deflection of the ion beam. The electrostatic bend can further include an intermediate electrode disposed downstream of said inner electrode and opposed to said outer electrode, wherein said inner electrode and said intermediate electrodes are configured for application of independent electric potentials thereto. In some cases, the outer electrode and the intermediate electrode can be held at the same electric potential.

In some embodiments, the outer electrode of the electrostatic bend includes an upstream portion and a downstream portion disposed at an angle relative to one another such that said downstream portion is capable of capturing at least a portion of neutral species present in the ion beam. The upstream and the downstream portions can integrally form the outer electrode, or they can be separate pieces that are electrically coupled.

In some embodiments, the system can further include another corrector device disposed downstream of said electrostatic bend, said another corrector device being configured to adjust a current density profile of the ion beam along said longitudinal dimension. In some embodiments, this downstream corrector device can include a plurality of spaced electrode pairs stacked along the longitudinal dimension of the ion beam with the electrodes of each pair spaced apart to form a gap for passage of the ion beam therethrough, wherein said electrode pairs are configured to be individually biasable by application of electrostatic voltages thereto for locally deflecting the ion beam along said longitudinal dimension.

In some embodiments, the electrode pairs of said corrector devices are staggered relative to one another along the longitudinal dimension of the ion beam. For example, the electrode pairs of the downstream corrector device can be offset vertically (along the longitudinal dimension of the beam) relative to the respective electrode pairs of the upstream corrector device, e.g., by half of the longitudinal height of the electrodes of the corrector devices (half the pixel size).

In some embodiments, the system can further include another focusing lens (herein also referred to as a second focusing lens) that is disposed downstream of said another corrector device for reducing divergence of the ion beam along said transverse dimension. Further, in some cases, an electrically grounded element can be disposed downstream of said another focusing lens. The electrically grounded element can include, e.g., a pair of electrically grounded electrodes that are spaced apart to allow the passage of the ion beam therebetween. The second focusing lens can include at least one focusing element disposed relative to said grounded element to form a gap therewith, wherein an electric potential difference between the focusing element and the grounded element generates an electric field in the gap for reducing divergence of the ion beam along the transverse dimension.

In other aspects, a system for decelerating a ribbon ion beam is disclosed, which comprises at least one deceleration element defining a region for receiving the ribbon ion beam and decelerating ions thereof, at least a pair of deflecting electrodes spaced apart to receive said decelerated ion beam therebetween and to cause a deflection thereof, and a corrector device configured to provide a channel for passage of said deflected ion beam and to adjust a current density profile of the ion beam in a non-dispersive plane.

In some embodiments, the corrector device can include a plurality of spaced electrode pairs stacked along a longitudinal dimension of the ion beam with the electrodes of each pair spaced apart to form a gap for passage of the ion beam therethrough, wherein said electrode pairs are configured to be individually biasable by application of electrostatic voltages thereto for locally deflecting the ion beam along said longitudinal dimension. In some embodiments, the plurality of spaced electrode pairs can include an inner and an outer opposed electrodes and an intermediate electrode disposed downstream of said inner electrode and opposed to said outer electrode, wherein said outer, said inner and said intermediate electrodes are configured to be held at independent electrical potentials. By way of example, the inner and the outer electrodes can be held at different electric potentials so as to cause deflection of the ion beam while the outer and the intermediate electrodes are held at the same electric potential. The outer electrode can include an upstream portion and a downstream portion, wherein said downstream portion is disposed at an angle relative to the upstream portion so as to capture neutral species present in said ion beam. In some embodiments, the upstream portion and the downstream portion of the outer electrode integrally form said outer electrode.

The system can further include at least one voltage source for applying the electrostatic voltages to said electrode pairs of the corrector device. A controller in communication with said at least one voltage source can be provided for adjusting voltages applied to said electrode pairs of the corrector device. By way of example, the controller can determine voltages for application to said electrode pairs of the corrector device based, e.g., on a measured current density profile of said received ion beam.

The system can further include a focusing lens configured to reduce divergence of the ion beam along a transverse dimension thereof. The focusing lens can include at least one focusing element, e.g., a pair of electrodes spaced to allow the passage of an ion beam therebetween. In some embodiments, an electrically grounded element, e.g., a pair of spaced electrodes, is disposed downstream of the focusing element. The electrically grounded element can be disposed relative to the focusing element to form a gap therebetween. The grounded element and the focusing element can be held at different electric potentials for generating an electric field in said gap adapted to reduce divergence of the ion beam along said transverse dimension.

In another aspect, an ion implantation system is disclosed, which comprises an ion source adapted to generate a ribbon ion beam, an analyzer magnet for receiving the ribbon ion beam and generating a mass-selected ribbon ion beam, and a corrector system configured to receive the mass-selected ribbon ion beam and to adjust a current density profile of the ion beam along its longitudinal dimension to generate an output ribbon ion beam having a substantially uniform current density profile along said longitudinal dimension.

In some embodiments, the corrector system can be further configured to decelerate or accelerate ions of said received mass-selected ion beam so as to generate a decelerated/accelerated output ribbon ion beam having a substantially uniform current density profile along said longitudinal dimension. In some embodiments, the output ribbon ion beam exhibits a current density profile along said longitudinal dimension with a root-mean-square (RMS) deviation, or non-uniformity, of equal to or less than about 5%. For example, the output ribbon ion beam can exhibit a current density profile along said longitudinal dimension with an RMS deviation, or non-uniformity, of equal to or less than about 4%, or equal to or less than about 3%, or equal to or less than about 2%, or equal to or less than about 1%.

In some embodiments, the corrector system in the above ion implantation system can further include a focusing lens for reducing divergence of the ribbon ion beam along a transverse dimension thereof. Further, in some embodiments, the corrector system can be configured to remove at least a portion of neutral species, such as neutral atoms and/or molecules, present in said mass-selected ion beam. For example, the corrector system can include an electrostatic bend for changing a propagation direction of ions in the ion beam with the neutral species continuing to propagate along their propagation direction to be captured by a beam stop, e.g., a portion of an outer electrode of the electrostatic bend.

The ion implantation system can further include an end-station for holding a substrate, e.g., a wafer, wherein said output ribbon ion beam propagates to said end-station to be incident on said substrate. In some embodiments, the corrector system can be configured to adjust a propagation direction of the ion beam such that said output ribbon ion beam is incident on a surface of the substrate along a direction forming a desired angle, e.g., a 90-degree angle, with the substrate surface.

In some embodiments, the corrector system of the ion implantation system can cause an oscillating motion of the ion beam so as to improve dose uniformity of ions implanted by said output ribbon beam in said substrate.

In some embodiments, the corrector system of the ion implantation system can include at least one corrector device for adjusting a current density profile of the ion beam along said longitudinal dimension. Such a corrector device can include, for example, a plurality of spaced electrode pairs stacked along the longitudinal dimension of the ion beam with the electrodes of each pair spaced apart to form a gap for passage of the ion beam therethrough, wherein said electrode pairs are configured to be individually biasable by application of electrostatic voltages thereto for locally deflecting the ion beam in the non-dispersive plane. The ion implantation system can also include at least one voltage source for application of voltages to said electrode pairs of the corrector device and a controller in communication with said at least one voltage source for adjusting said voltages applied to the electrode pairs.

In some aspect, a method for changing an energy of a ribbon ion beam is disclosed, which comprises passing a ribbon ion beam through a region in which an electric field is present for decelerating or accelerating ions of the beam, adjusting a current density profile of the ribbon beam along a longitudinal dimension thereof, and reducing divergence of the ribbon ion beam along a transverse dimension thereof. The step of reducing divergence of the ion beam can include passing the ion beam through a focusing lens.

In some embodiments, the ribbon ion beam can have an initial energy in a range of about 10 to about 100 keV. In some embodiments, the step of decelerating or accelerating the ions of the ion beam changes an energy of the ion beam by a factor in a range of about 1 to about 30.

The step of adjusting a current density profile of the ion beam along its longitudinal dimension can include utilizing a corrector device adapted for locally deflecting the beam along said longitudinal dimension so as to generate a substantially uniform current density profile along said longitudinal dimension.

In some aspect, a method of implanting ions in a substrate is disclosed, which comprises extracting a ribbon ion beam from an ion source, passing the ribbon ion beam through an analyzer magnet to generate a mass-selected ribbon ion beam, adjusting a current density profile of the mass-selected ribbon ion beam along at least a longitudinal dimension thereof to generate an output ribbon ion beam having a substantially uniform current density profile along the longitudinal dimension, and directing said output ribbon ion beam onto a substrate for implanting ions therein.

In some embodiments, a corrector device can be configured to perform said step of adjusting the current density profile of the mass-selected ribbon ion beam. By way of example, a corrector device can adjust the current density profile of the mass-selected ribbon ion beam so as to obtain an ion beam exhibiting a substantially uniform current density profile.

In some embodiments, the ion implantation method can further include decelerating or accelerating ions of the said mass-selected ribbon ion beam such that said output ribbon ion beam has an energy different than an energy of said mass-selected ribbon ion beam.

In some embodiments, the implanted ion dose can be in a range of about $10^{12}$ cm$^{-2}$ to about $10^{16}$ cm$^{-2}$. The ion current can be, for example, a few tens of microamperes (e.g., 20 microamperes) to a few tens of milliamperes (e.g., 60 milliamperes), e.g., in a range of about 50 microamperes to about 50 milliamperes, or in a range of about 2 milliamperes to about 50 milliamperes.

In many ion implantation applications, an electrostatic bend composed of two spaced-apart electrodes, such as the electrostatic bend discussed above, disposed downstream of an acceleration/deceleration system can be effective in bending an ion beam without causing significant angular divergence of the beam ("blow-up") even when the acceleration/deceleration system operates to decelerate the received ions at a moderate deceleration ratio. It has, however, been discovered that the use of a conventional electrostatic bend downstream of a deceleration system that is configured to decelerate ions at a high deceleration ratio may lead to over-focusing of the ions, which can in turn lead to the ("blow-up") of the ion beam as it traverses downstream components. The blow-up of the beam can lead to ion loss and can interfere with the operation of the ion implantation system. Moreover, in some conventional ion implantation systems the use of focusing lenses that require high voltages may lead to transient beam instability, e.g., due to arcing, and generation of contaminants in the form of neutral atoms/molecules via charge exchange reactions. Some aspects of the present teachings discussed below relate to solving these problems.

In one aspect, an ion implantation system is disclosed, which comprises a deceleration system configured to receive an ion beam and decelerate the ion beam at a deceleration ratio of at least 2, and an electrostatic bend disposed downstream of the deceleration system for causing a deflection of the ion beam. The electrostatic bend comprises a first electrode pair disposed downstream of the deceleration system for receiving the decelerated beam, said first electrode pair having an inner and an outer electrode spaced apart to allow passage of the ion beam therebetween, a second electrode pair disposed downstream of said first electrode pair and having an inner and an outer electrode spaced apart to allow the passage of the ion beam therebetween, and an end electrode pair disposed downstream of the second electrode pair and having an inner and an outer electrode spaced apart to allow the passage of the ion beam therebetween. The first, second and end electrode pairs are configured to be independently biased. In some embodiments, each of the electrodes of the end electrode pair is held at an electric potential less than an electric potential at which any of the electrodes of the second electrode pair is held. The electrodes of the first electrode pair are also held at a lower electric potential relative to the electrodes of the second electrode pair.

In some embodiments, the deceleration system is configured to provide a deceleration ratio in a range of about 5 to about 100, e.g., in a range of about 10 to about 80, or in a range of about 20 to about 60, or in a range of about 30 to about 50.

In some embodiments, the inner electrode of each of the electrode pairs is held at an electric potential less than an electric potential at which a respective outer electrode of that electrode pair is held so as to cause deflection of an ion beam composed of positively charged particles.

The inner and outer electrode of the first electrode pair can form an angle relative to a respective electrode of the second electrode pair. Further, each of the inner and outer electrode of the end electrode pair forms an angle relative to a respective electrode of the second electrode pair.

In some embodiments, the outer electrodes of the first and the end electrode pairs are held at a first electric potential $V_1$ and the inner electrodes of the first and the end electrode pairs are held at a second electric potential $V_2$. Further, the inner electrode of the second electrode pair is electrically grounded and the outer electrode of the second electrode pair is held at a third electric potential $V_3$. The voltage $V_1$ can be greater than the voltage $V_2$. By way of example, $V_1$ can be in a range of about 0 V to about −30 kV, $V_2$ can be in a range of about 0 V (zero volt) to about −30 kV (minus 30 kV), and $V_3$ can be in a range of about 0 V to about +30 kV.

In some embodiments, the ion beam is a ribbon ion beam while in other embodiments it is a circular beam.

In some embodiments, the ion beam received by the deceleration system has an ion energy in a range of about 10 keV to about 60 keV, e.g., in a range of about 10 keV to about 20 keV, and an ion current in a range of about 0.1 mA to about 40 mA, e.g., in a range of about 5 mA to about 40 mA.

In some embodiments, the deceleration system includes a deceleration element that is separated from a downstream focusing element such that a gap is defined therebetween. The deceleration system can include two opposed separated equipotential electrode portions providing a channel therebetween for passage of the ion beam. The focusing element can also include two equipotential separated electrode portions providing a channel therebetween for passage of the ion beam. In some embodiments, the separated electrode portions of each of the deceleration element and the focusing element can be connected at their top and bottom ends to form, e.g., a square-shaped electrode. The electrodes of the deceleration element and the focusing element are held at different electric potentials to provide an electric field in the gap for decelerating the received ion beam. The electric field can also cause focusing of the ion beam as the ion beam traverses the gap.

The ion implantation system can further include an ion source for generating the ion beam and an analyzer magnet disposed downstream of the ion source and upstream of the deceleration system for receiving the ion beam generated by the ion source and generating a mass-selected ion beam.

In a related aspect, an ion implantation system is disclosed, which includes an electrostatic bend for causing deflection of an ion beam, where the electrostatic bend includes a first electrode pair having an inner and outer electrode spaced apart to allow passage of an ion beam therebetween, a second electrode pair disposed downstream of said first electrode pair and having an inner and an outer electrode spaced apart to allow passage of the ion beam therebetween, and an end electrode pair disposed downstream of said second electrode pair and having an inner and outer electrode spaced apart to allow passage of the ion beam therebetween. Each of the electrodes of the end electrode pair is held at an electric potential less than an electric potential at which any of the electrodes of the second electrode pair is held and the electrodes of the first electrode pair are held at a lower electric potential relative to the electrodes of the second electrode pair. Further, an inner electrode of each of said electrode pairs is held at an electric potential less than an electric potential at which a respective outer electrode of that electrode pair is held.

In some embodiments of the above ion implantation system, the outer electrodes of the first and the end electrode pairs are held at a first electric potential ($V_1$) and the inner electrodes of the first and the end electrode pairs are held at a second electric potential ($V_2$). Further, the inner electrode of the second electrode pair is electrically grounded and the outer electrode of the second electrode pair is held at a third electric potential ($V_3$). The voltage $V_1$ can be more positive than the voltage $V_2$. By way of example, $V_1$ can be in a range of about 0 V to about −30 kV (minus 30 kV), $V_2$ can be in a range of 0 V to about −30 kV, and $V_3$ is in a range of about 0 V to about +30 kV.

In some embodiments, the ion implantation system can further include a split lens disposed downstream of the electrostatic bend. The split lens can include a first electrode pair having a curved downstream end face, a second electrode pair having a curved upstream end face, where the end faces of the two electrode pairs are separated from one another to form a gap therebetween. The first and second electrode pairs are configured to be independently biased. For example, the first and second electrode pairs are biased so as to generate an electric field in said gap for focusing the ion beam passing through the split lens.

In another aspect, an ion implantation system is disclosed, which comprises an electrostatic bend for receiving an ion beam and causing a deflection thereof, and a split lens disposed downstream of said electrostatic bend. The split lens includes a first electrode pair having a curved downstream end face, and a second electrode pair having a curved upstream end face, where the end faces of the two electrode pairs are separated from one another to form a gap therebetween. The first and second electrode pairs are configured to be independently biased, for example, to generate an electric field in the gap for focusing the ion beam passing through the split lens. The ion implantation system can further include an acceleration/deceleration system disposed upstream of said electrostatic bend, and a mass analyzer disposed upstream of the acceleration/deceleration system for receiving an ion beam and generating a mass-selected ion beam. In some embodiments, the electrostatic bend can include a first electrode pair, a second electrode pair and an end electrode pair each of which has an inner electrode and an outer electrode spaced apart to allow passage of the ion beam therebetween. The three electrode pairs are configured to be independently biased. For example, each of the electrodes of the end electrode pair can be held at an electric potential less than an electric potential at which any of the electrodes of the second electrode pair is held and the electrodes of the first electrode pair can be also held at a lower electric potential relative to the electrodes of the second electrode pair. In some embodiments, the outer electrodes of the first and the end electrode pairs are held at a first electric potential ($V_1$) and the inner electrodes of the first and the end electrode pairs are held at a second electric potential ($V_2$). In some embodiments, $V_1$ is more positive than $V_2$. Further, the inner electrode of the second electrode pair can be electrically grounded and the outer electrode of the second electrode pair can be held at a third electric potential ($V_3$).

Further understanding of various aspects of the present teachings can be obtained by reference to the following detailed description in conjunction with the associated drawings, which are described briefly below.

BRIEF DESCRIPTION OF THE DRAWINGS

FIG. 3A is a partial schematic view of an ion source for generating a ribbon ion beam, FIG. 3B is another partial schematic view of the ion source of FIG. 3A.

DETAILED DESCRIPTION

In some aspects, the present teachings are directed to an ion implantation system (herein also referred to as an ion implanter) that includes an ion source for generating a ribbon ion beam and a corrector system for ensuring that the ribbon ion beam exhibits, at a substrate on which the beam is incident, a substantially uniform current density profile at least along its longitudinal dimension. In some cases, the corrector system as well as other optics in the beam line of the ion implantation system can be employed to substantially preserve (e.g., within about 5% or better) the profile of a ribbon ion beam extracted from an ion source as the ion beam is transported to a substrate for implanting ions therein.

In some embodiments, the ion implantation system according to the present teachings includes a beam line having two stages: a beam injector stage followed by a beam correction stage that can also optionally include a mechanism for decelerating or accelerating the ion beam. The injector stage can include beam generation and mass selection. In some embodiments, the beam correction stage can include corrector arrays as well as deceleration/acceleration optics. In some embodiments, the beam line is configurable for implanting ions in either 300-mm substrates (e.g., via a ribbon ion beam that is approximately 350-mm tall) or 450-mm substrates (e.g., via a ribbon ion beam that is approximately 500-mm tall). For example, the beam line can include a replaceable ion optics configuration kit for accommodating different substrate sizes. The ion optics configuration kit can include, for example, an extraction electrode for extracting an ion beam from a source, corrector arrays, deceleration/acceleration stage optics as well as substrate handling components in the ion implanter end-station, such as replacement end effectors and FOUPs (Front Opening Unified Pods).

Figure 1:
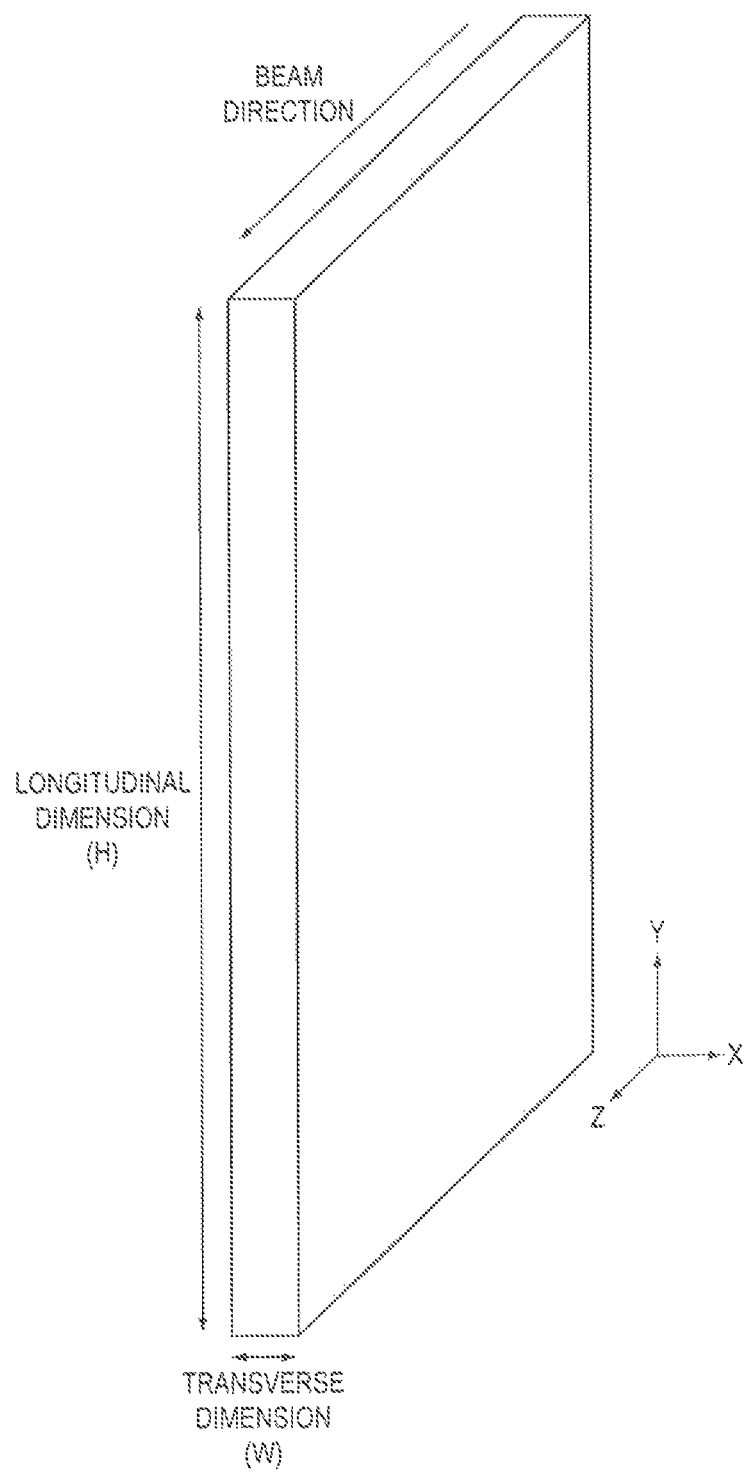
FIG. 1 schematically depicts a ribbon ion beam.

Various exemplary embodiments of the present teachings are described below. The terms utilized in the description of these embodiments have their ordinary meanings in the art. The following terms are defined for further clarity:

The term "ribbon ion beam" as used herein refers to a beam of ions having an aspect ratio defined as the ratio of its largest dimension (herein also referred to as the longitudinal dimension of the beam) to its smallest dimension (herein also referred to as the transverse dimension of the beam), which is at least about 3, e.g., equal to or greater than 10, or equal to or greater than 20, or equal to or greater than 30. A ribbon ion beam can exhibit a variety of different cross-sectional profiles. For example, a ribbon ion beam can have a rectangular or an elliptical cross-sectional profile. FIG. 1 schematically depicts an exemplary ribbon ion beam having a longitudinal dimension (herein referred to also as height) H and a transverse dimension (herein also referred to as width) W. Without loss of generality, in the following description of various embodiments of the invention, the propagation direction of the ion beam is assumed to be along the z-axis of a Cartesian coordinate system with the longitudinal dimension along the y-axis and the transverse dimension along the x-axis. As discussed in more detail below, in many embodiments, an analyzer magnet is employed to disperse the ion beam in a plane perpendicular to the propagation direction of the ion beam. This plane is herein referred to as the dispersive plane. In the following embodiments, the dispersive plane corresponds to the xz plane. A plane perpendicular to the dispersive plane is referred to as a non-dispersive plane. In the following embodiments, the non-dispersive corresponds to the yz plane.

The term "current density" is used herein consistent with its use in the art to refer to an electric current associated with ions flowing through a unit area, e.g., a unit area perpendicular to the direction of propagation of the ions.

The term "current density profile" as used herein refers to the ion current density of the beam as a function of location along the beam. For example, the ion current density profile along a longitudinal dimension of the beam refers to the ion current density as a function of distance from a reference point (e.g., an upper edge, or a lower edge, or a center of the beam) along the ion beam's longitudinal dimension, or an electric current associated with ions flowing through a unit length along the longitudinal dimension.

The term "substantially uniform current density profile" refers to an ion current density profile that exhibits an RMS variation of at most 5%.

The term "deceleration ratio" refers to the ratio of the energy of an ion beam entering a deceleration system relative to the energy of the ion beam exiting the deceleration system (i.e., the ratio of the ion beam received by the deceleration system relative to the energy of the decelerated ion beam).

Figure 2A:
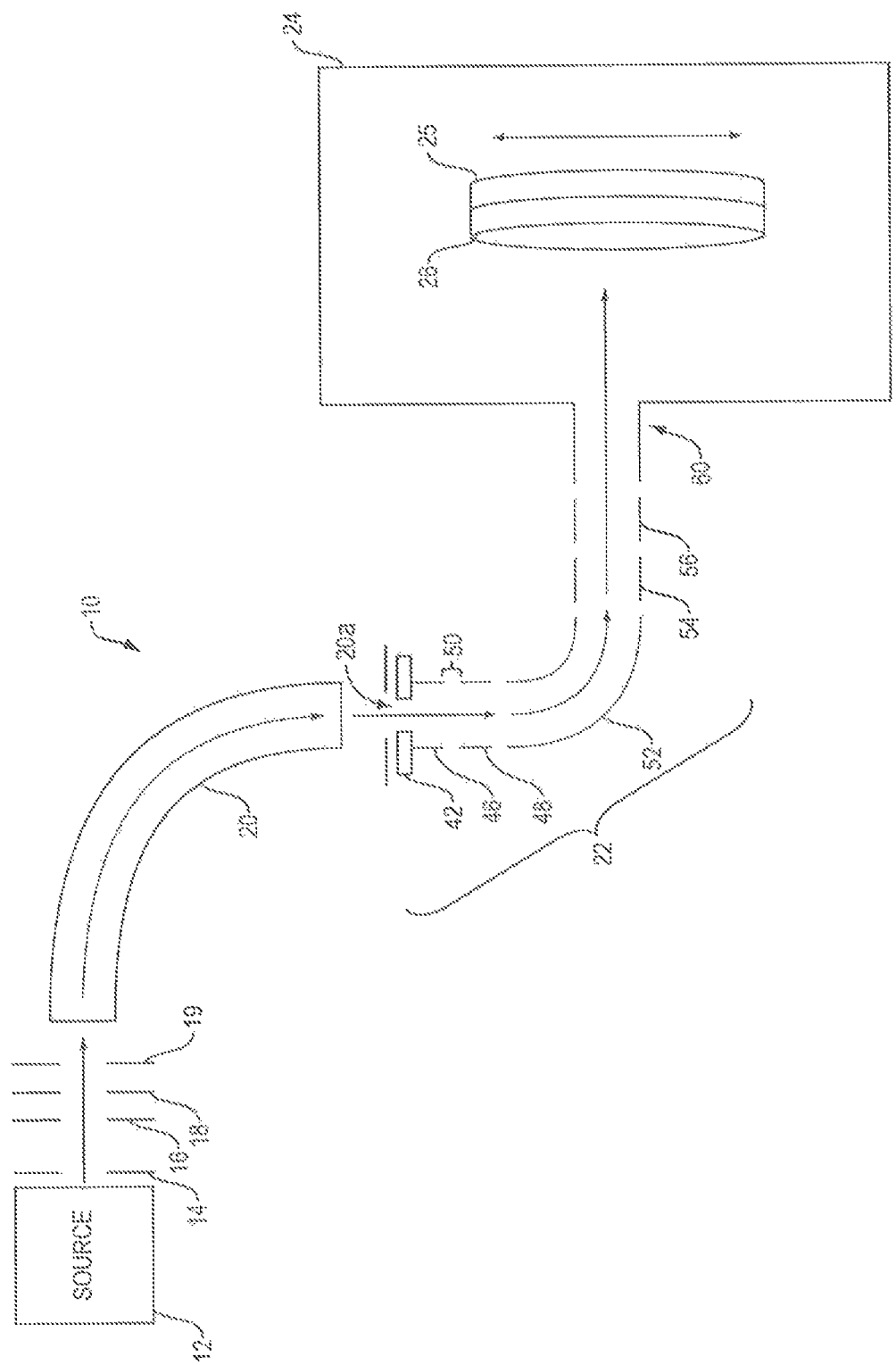
FIG. 2A schematically depicts an ion implantation system in accordance with an embodiment of the present teachings, FIG. 2B schematically depicts a corrector system according to an embodiment of the present teachings employed in the ion implantation system of FIG. 2A.
Figure 2B:
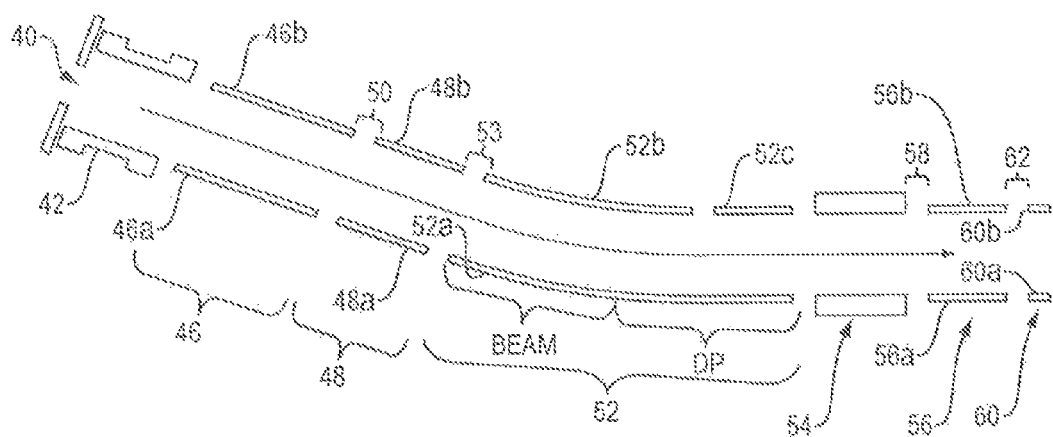
FIG. 2C is a schematic side cross-section view of a portion of the corrector system shown in FIG. 2B.
Figure 2C:
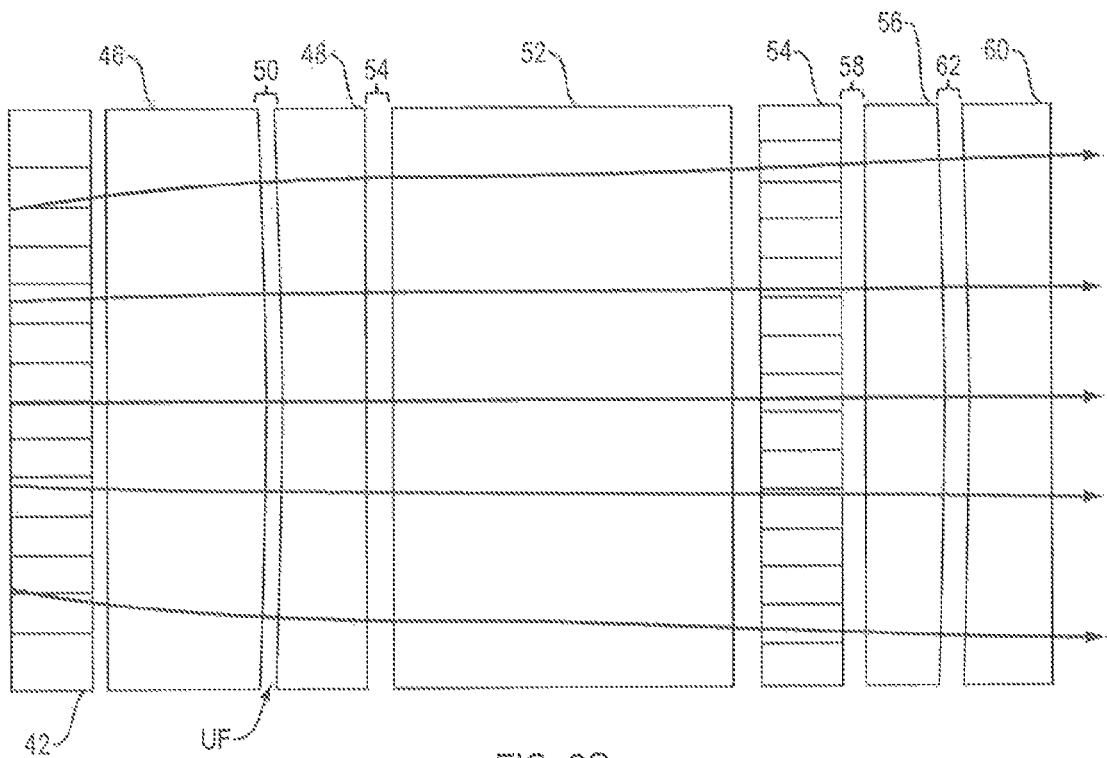

With reference to FIGS. 2A, 2B, and 2C, an ion implantation system 10 according to an embodiment of the present teachings includes an ion source 12 for generating a ribbon ion beam, and a puller electrode 14 that is electrically biased to facilitate extraction of the ion beam from the source. A suppression electrode 16 is electrically biased to inhibit back streaming of neutralizing electrons (e.g., electrons generated via ionization of the ambient gas by the ion beam) to the source, a focus electrode 18 is electrically biased to reduce divergence of the ion beam, and a ground electrode 19 defines the reference ground for the ion beam. An analyzer magnet 20 disposed downstream of the focus electrode 18 receives the ribbon ion beam and generates a mass-selected ion beam.

In some embodiments, the source housing and the analyzer magnet frame assembly can be electrically isolated from ground potential. For example, they can be floated below ground potential, e.g., by −30 kV. In some cases, the floating voltage can be selected such than the ion beam is extracted from the ion source and mass analyzed at a higher energy than its energy at a substrate on which it is incident for implanting ions therein. Alternatively, the ion beam can be extracted and mass analyzed and subsequently accelerated to be incident on the substrate at a higher energy.

Again with reference to FIGS. 2A-2C, the exemplary ion implantation system 10 further includes a corrector system 22 for adjusting the current density profile of the ion beam along at least a longitudinal dimension thereof (e.g., in the non-dispersive plane of the ion beam) to generate an output ribbon ion beam that exhibits a substantially uniform current density profile along at least its longitudinal dimension, as discussed in more detail below. Further, the corrector system 22 can adjust the transverse size of the ion beam, e.g., reduce the divergence of the ion beam along the transverse dimension (e.g., in the dispersive plane), to ensure that the output ion beam has a desired transverse size.

In some embodiments, such as those discussed below, the corrector system 22 can further provide deceleration/acceleration of the mass-selected ribbon ion beam. In this manner, an output ribbon ion beam having a desired energy and a substantially uniform current density profile can be obtained. Without loss of generality, in the embodiments discussed below, the corrector system 22 is also referred to as a deceleration/acceleration system. It should be understood, however, that in some embodiments, the corrector system 22 may not provide any deceleration or acceleration of the ion beam.

The exemplary ion implantation system 10 further includes an end-station 24, which includes a substrate holder 25 for holding a substrate 26 in the path of the ribbon ion beam exiting the corrector system 22. The output ribbon ion beam is incident on the substrate to implant ions therein. In this embodiment, the substrate holder can be scanned along one dimension orthogonal to the propagation direction of the beam in a manner known in the art to expose different parts of the substrate to the ion beam for implanting ions therein. In some embodiments, the longitudinal size of the ion beam is greater than the diameter of the substrate such that a linear movement of the substrate along a dimension perpendicular to the propagation direction of the ion beam can result in the implantation of ions across the entire substrate. The substantial uniformity of the current density of the output ribbon ion beam ensures that a uniform dose of the implanted ions is achieved across the substrate.

A variety of different ion sources that are capable of generating a ribbon ion beam can be employed as the ion source 12. Some examples of ions sources that can generate a ribbon ion beam are described in U.S. Pat. No. 6,664,547 entitled "Ion Source Ribbon Beam with Controllable Density Profile," and U.S. Pat. No. 7,791,041 entitled "Ion Source, Ion Implantation Apparatus, and Ion Implantation Method," which are herein incorporated by reference in their entirety.

Figure 3C:
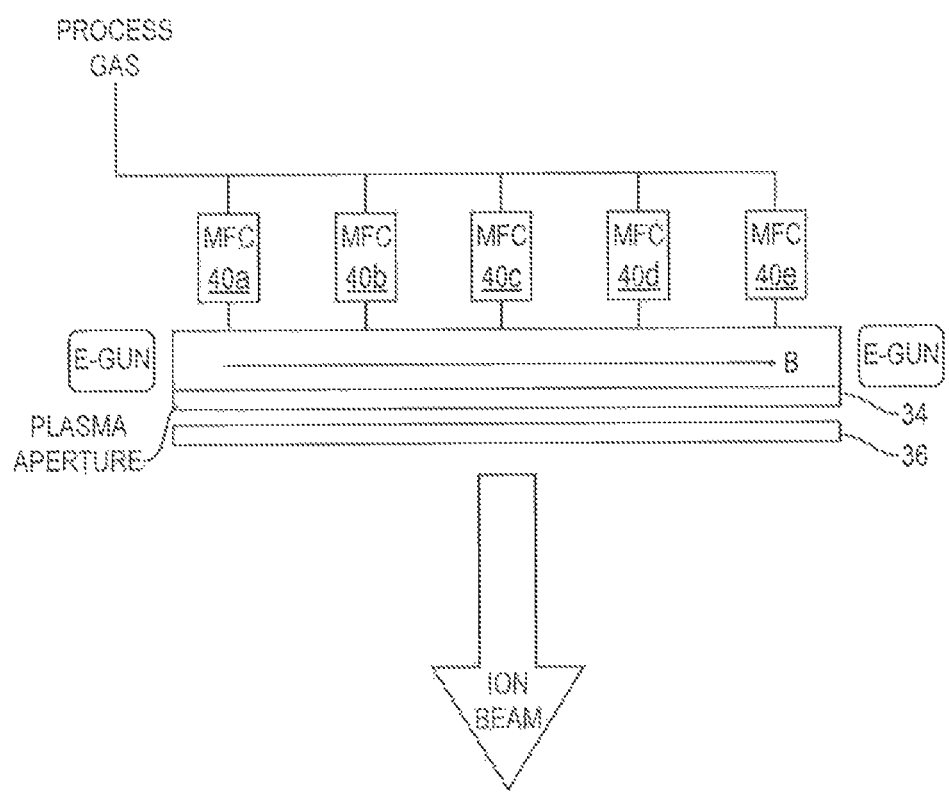
FIG. 3C is another partial schematic view of the ion source of FIGS. 3A and 3B.

The ion source 12 employed in this embodiment is described in detail in U.S. Published Application No. 2014/0265856 entitled "Magnetic Field Sources For An Ion Source," and in U.S. Pat. No. 8,994,272 entitled "Ion Source Having At Least One Electron Gun Comprising A Gas Inlet And A Plasma Region Defined By An Anode And A Ground Element Thereof," both of which are assigned to the assignee of the present application and are herein incorporated by reference in their entirety. Briefly, with reference to FIGS. 3A, 3B, and 3C, the ion source 12 can include two opposed external electron guns 28/30 disposed at the ends of a long, narrow, rectangular ionization chamber 32 (source body). Each electron gun can include an indirectly-heated cathode (IHCs) 28a/30a and an anode 28b/30b. As shown in FIG. 3C, a plasma electrode 34 in the form of a plate contains an aperture shaped to allow ion extraction from the source (e.g., the aperture can be a 450 mm by 6 mm slot). The ion extraction is assisted by a puller electrode 36 of similar shape as the plasma electrode and spaced apart from the plasma electrode by one or more electrically insulating spacers (not shown). In some embodiments, the puller electrode 36 can be biased relative to the source body and the plasma electrode by up to −5 kV.

With reference to FIG. 3B, the source body is immersed in an axial magnetic field generated by electromagnetic coil assembly 38. In this embodiment, the coil assembly comprises three sub-coils, which are distributed along the long axis of the source body and generate independent, partially overlapping magnetic fields over the top, the middle and the bottom of the source body. The magnetic field confines the primary electron beams generated by the electron guns, thus creating a well-defined plasma column along the axis of the ionization chamber. The magnetic flux density generated by each of the three coil segments can be independently adjusted to ensure that the current density of the extracted ion beam is substantially free of non-uniformities.

With reference to FIG. 3C, five separate gas feeds 40a, 40b, 40c, 40d, and 40e distributed along the long axis of the source body, each with its own dedicated mass flow controller (MFC), can be utilized to adjust the ion density along the plasma column. In this embodiment, the anodes and the cathodes of the electron guns, as well as the plasma electrode and the puller electrode, are formed of graphite. The ionization chamber is formed of aluminum and its inner surface is coated with graphite.

Figure 4:
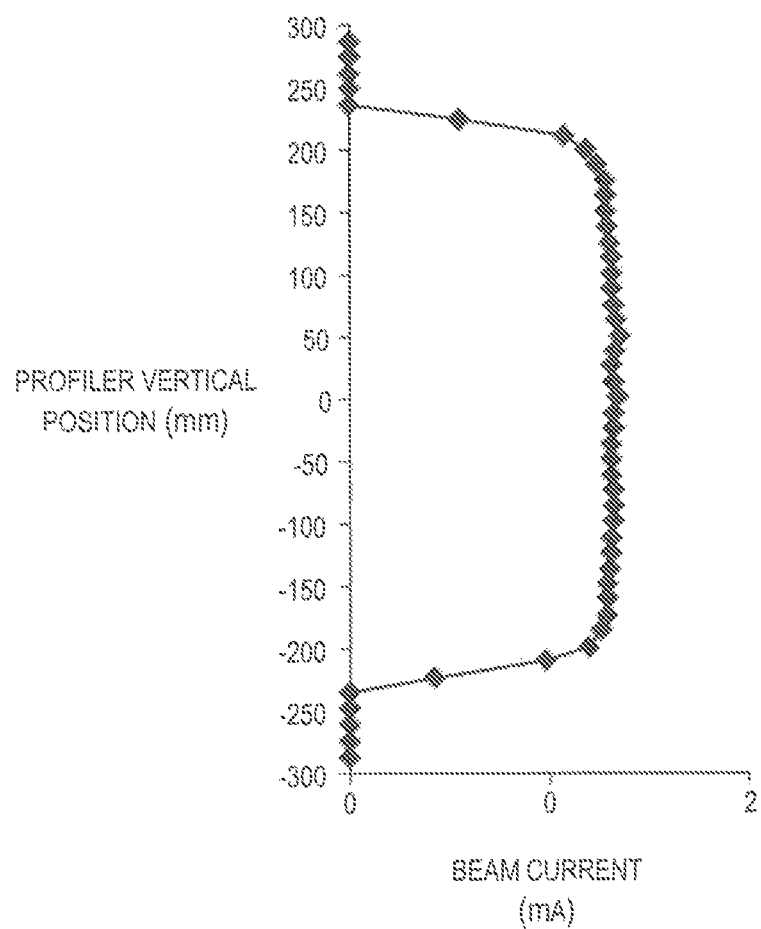
FIG. 4 depicts a current profile of an exemplary ribbon ion beam generated by an ion source based on the ion source described below in connection with FIGS. 3A-3B, FIG. 5 schematically depicts a corrector system suitable for use in an embodiment of the present teachings, FIG. 6 schematically depicts a ribbon ion beam passing through a corrector device according to an embodiment of the present teachings, FIG. 7A schematically depicts a ribbon ion beam passing through a corrector device according to an embodiment of the present teachings, which is configured to apply transverse electric field to at least a portion of the ion beam, FIG. 7B schematically depicts a ribbon ion beam passing through a corrector device according to an embodiment of the present teachings, which is configured to apply a longitudinal electric field to the beam for causing a deflection thereof, FIG. 7C schematically depicts a ramp voltage for application to the electrode pairs of the corrector device depicts in FIG. 7B, FIG. 8A schematically depicts a ribbon ion beam passing through a corrector device according to an embodiment of the present teachings, which is configured to cause a longitudinal oscillating motion of the beam, FIG. 8B schematically depicts a triangular voltage waveform for application to the electrode pairs of the corrector device depicts in FIG. 8A.

The extracted ion beam can be analyzed by a retractable beam profiler located in the ion source housing. By way of illustration, FIG. 4 depicts beam current as a function of vertical (longitudinal) position of a ribbon ion beam generated by a prototype of such an ion source. The current density profile along the longitudinal dimension exhibits an RMS non-uniformity of about 2.72%.

Referring again to FIG. 2A, in this embodiment, the ion beam generated by the ion source 12 is extracted and accelerated to a desired energy (e.g., between 5 and 80 keV) prior to entering the analyzer magnet 20. The analyzer magnet 20 applies a magnetic field to the ion beam in the non-dispersive plane to separate ions having different mass-to-charge ratios in the dispersive plane, thereby generating a mass-selected beam with a waist in the dispersive plane at the focal plane of the analyzer magnet. As discussed below, a variable size mass resolving aperture 20a disposed near the beam waist allows ions of a desired mass-to-charge ratio to pass downstream to other components of the system, as discussed in more detail below.

A variety of analyzer magnets known in the art can be utilized. In this embodiment, the analyzer magnet has a saddle coil design with a 600-mm pole gap, a bend angle of approximately 90 degrees and a 950 mm bend radius, though other pole gaps, bend angles and bend radii can also be utilized. The variable size mass resolving aperture 20a disposed allows ions of a desired mass-to-charge ratio to pass downstream to the deceleration/acceleration system 22. In other words, the analyzer magnet 20 generates a mass-selected ribbon ion beam that is received by the deceleration/acceleration system 22.

With continued reference to FIGS. 2A, 2B and 2C, the deceleration/acceleration system 22 includes a slot 40 for receiving the mass-selected ribbon ion beam. The slot 40 is sufficiently tall to accommodate the longitudinal dimension of the ion beam, e.g., in some implementations the slot 40 is 600 mm tall, and has a transverse dimension (e.g., a dimension in the dispersive plane) that is continuously variable within a selected range, e.g., between about 5 mm to about 60 mm.

Figure 5:
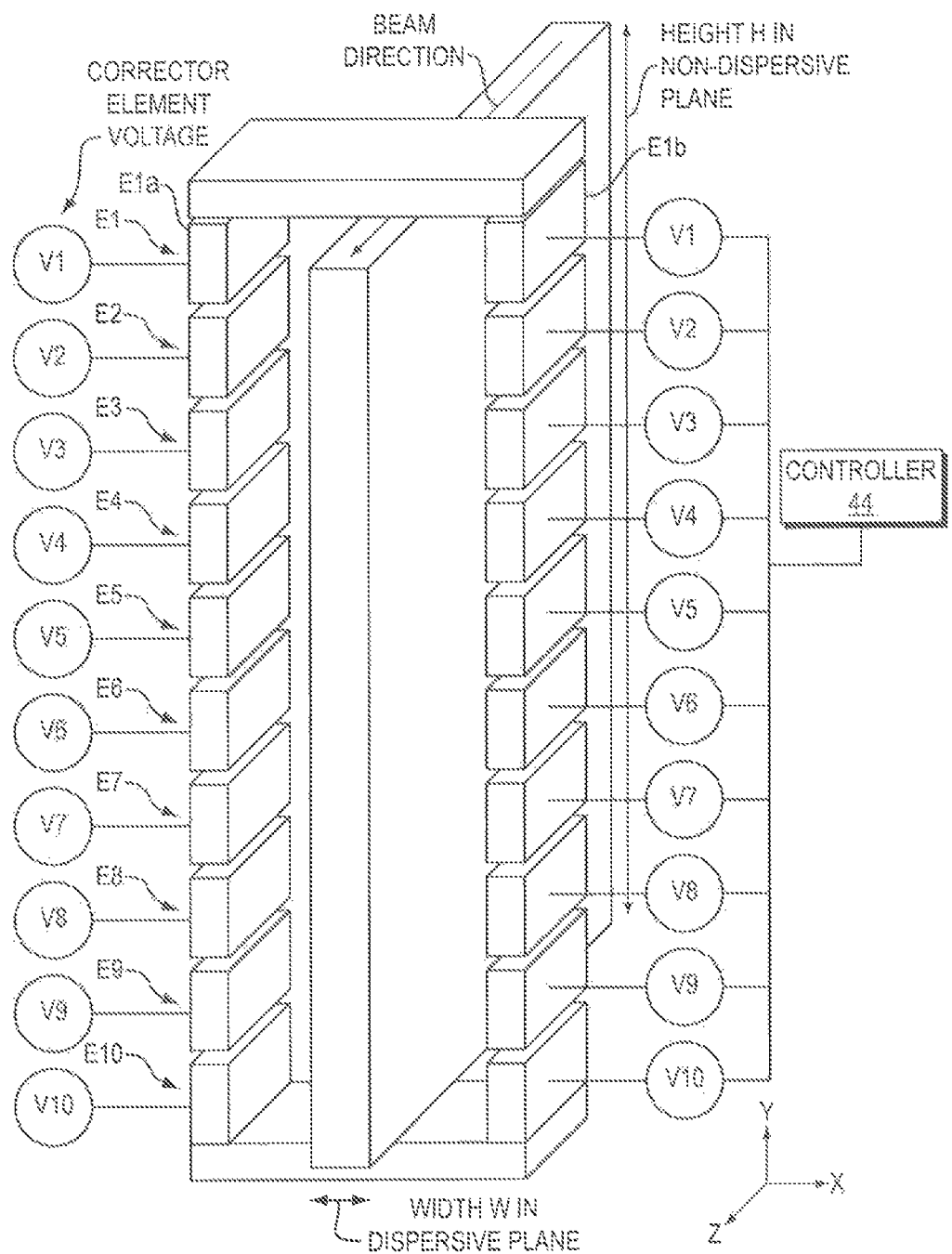

A corrector device 42 is disposed downstream of the slot 40 for receiving the ribbon beam passing through the slot. In this embodiment, as shown schematically in FIG. 5, the corrector device 42 includes a plurality of spaced electrode pairs E1, E2, E3, E4, E5, E6, E7, E8, E9, and E10 that are stacked along a longitudinal dimension of the ion beam (i.e., along the y-axis), where each electrode pair is individually electrically biasable. More specifically, in this embodiment, a plurality of electrostatic voltage sources V1, V2, V3, V4, V5, V6, V7, V8, V9 and V10 apply independent voltages to each electrode pair so as to generate an electric field with components along the longitudinal dimension of the ribbon ion beam to locally deflect one or more portions of the beam so as to adjust the current density profile of the beam along the longitudinal dimension. In this embodiment, such adjustment of the current density profile is performed to enhance the uniformity of the ion beam's current density along its longitudinal dimension (e.g., in the non-dispersive plane). The voltage source V1, . . . , V10 can be independent voltages sources or can be different modules of a single voltage source.

Each electrode pair comprises two electrodes, such as electrodes E1a and E1b, which are disposed substantially parallel to a plane defined by the propagation direction of the beam and its longitudinal dimension. The electrodes of the pairs are separated to provide a transverse gap through which the ion beam can pass. The number of electrode pairs can be selected, e.g., based on the longitudinal size of the ion beam, the resolution level required for correcting non-uniformities in the longitudinal profile of the ion beam, the type of ions in the beam, among other factors. In some embodiments, the number of electrode pairs can be, for example, in a range of about 10 to about 30.

A controller 44 in communication with the voltage sources V1, . . . , V10 can determine the voltages (e.g., electrostatic voltages) to be applied to the electrode pairs of the corrector device in a manner discussed in more detail below to locally deflect one or more portions of the ion beam passing between one or more of the electrode pairs by a selected angle, thereby adjusting the current density of the ion beam along its longitudinal dimension.

Figure 6:
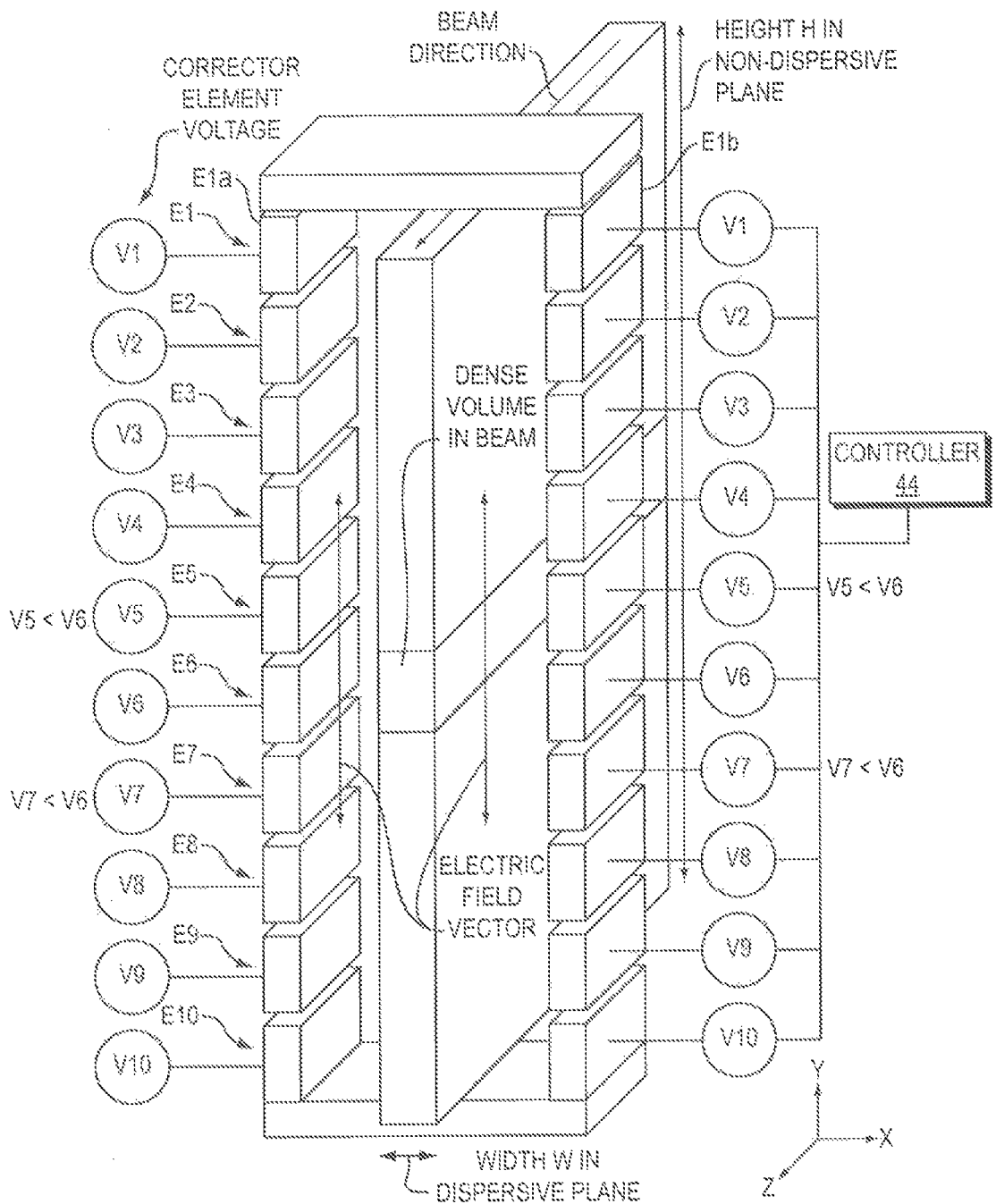

By way of example, FIG. 6 shows that three of the electrode pairs E5, E6 and E7 are biased by application of electrostatic voltages thereto such that the voltage applied to E6 is greater than the voltages applied to E5 and E7 so as to generate the electric field components shown by the arrows in the region through which the shaded portion of the ion beam, which exhibits a higher charge density than other portions of the beam, passes (in this example, the other electrode pairs are maintained at the ground potential). The electric field applied to the shaded portion of the beam causes an upward deflection of an upper segment of that portion and a downward deflection of a lower segment of that portion, thereby lowering the charge density in that portion to improve the uniformity of the current density profile along the longitudinal dimension.

Figure 7A:
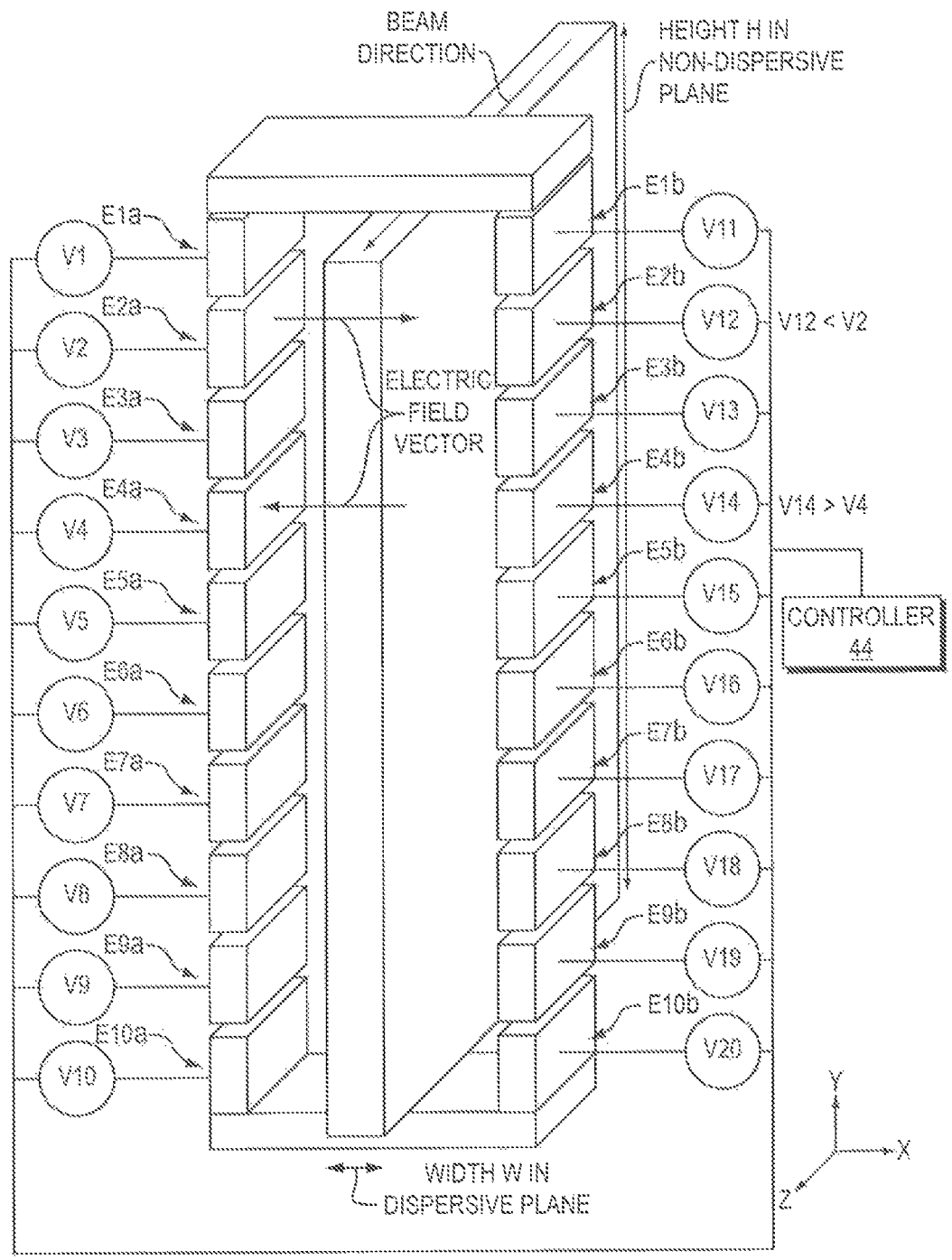

With reference to FIG. 7A, in some embodiments, the corrector device 42 can be configured to apply a transverse electric field to the ion beam (i.e., an electric field with components along the transverse dimension of the beam) so as to cause a transverse deflection of the beam, e.g., to change the propagation direction of the beam. More particularly, the corrector device 42 can be configured such that each electrode of the electrode pairs is individually biasable. For example, in this embodiment, voltage sources V1, ..., V20 can apply independent voltages (e.g., electrostatic voltages) to the electrodes of the electrode pairs (see, e.g., voltage sources V1 and V11 configured to apply independent voltages to the electrodes E1a and E1b of the electrode pair E1), respectively.

By way of example, a potential difference between the opposed electrode pairs of one or more electrodes can be selected to provide local transverse deflection(s) of one or more portions of the ion beam. For example, as shown in FIG. 7A, in this example, the voltage sources V2 and V12 apply different voltages v2 and v12 to the electrodes E2a and E2b (v12<v2) so as to cause a local deflection of a portion of the ion beam passing between these two opposed electrodes toward the electrode E2b. Concurrently, the voltage sources V4 and V14 apply different voltages v4 and v14 to the electrodes E4a and E4b (v14>v4) so as to cause a local deflection of a portion of the ion beam passing through these two opposed electrodes toward the electrode E4a. In some embodiments, the potential difference between two opposed electrodes can be in a range of about 0 V to about 4 kV.

In some cases, the entire ion beam can be deflected transversely, e.g., to change its direction of propagation, by applying one voltage to all of the electrodes on one side of the beam and another voltage to all of the electrodes on the opposed side.

Figure 7B:
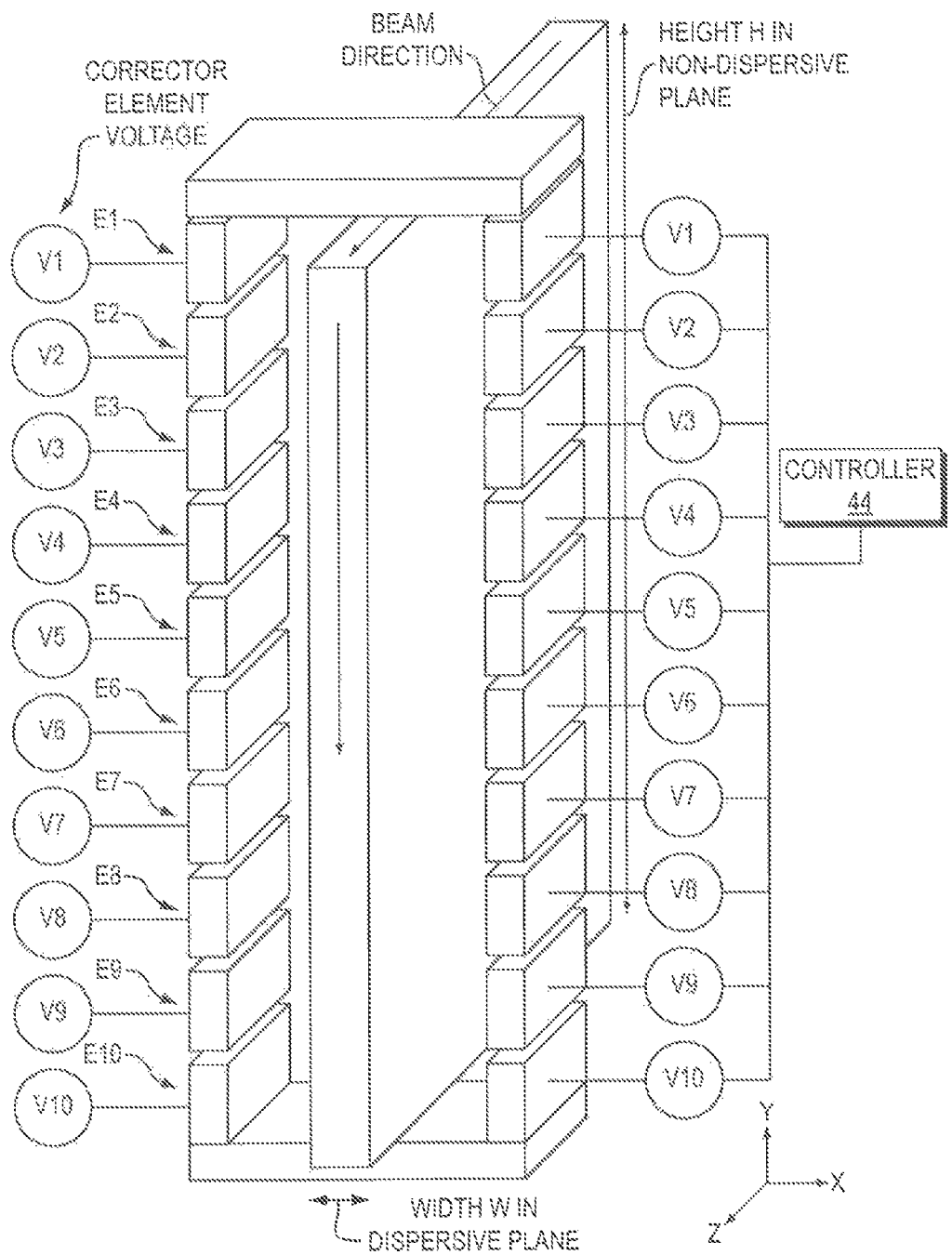

With reference to FIGS. 7B and 7C, in some embodiments, the corrector device 42 can be configured to deflect the entire ion beam along the longitudinal dimension (i.e., vertically along the y-axis). For example, as shown in FIG. 7C, the controller 44 can cause the voltage sources V1, ..., V10 to apply a voltage ramp to the electrode pairs E1 ..., E10 to generate an electric field having a component along the longitudinal dimension of the beam (shown schematically in FIG. 7B by an arrow), which can cause a longitudinal deflection of the beam.

The controller 44 in communication with the voltage source V1, ..., V20 can determine the voltages to be applied to the electrodes, e.g., based on a desired local or global deflection angle of the beam. The controller can determine the requisite voltages, e.g., based on the electric charge of the ions in the beam, a desired angle of deflection, in a manner known in the art. In some cases, the controller can effect the application of voltages to the electrodes of the electrode pairs so as to provide both local transverse as well as longitudinal deflection of the beam. For example, the voltage differences between different electrode pairs can cause local longitudinal deflections, e.g., in a manner discussed above in connection with FIG. 6, while voltage difference between the electrodes of the pairs can cause local transverse deflections.

Figure 8A:
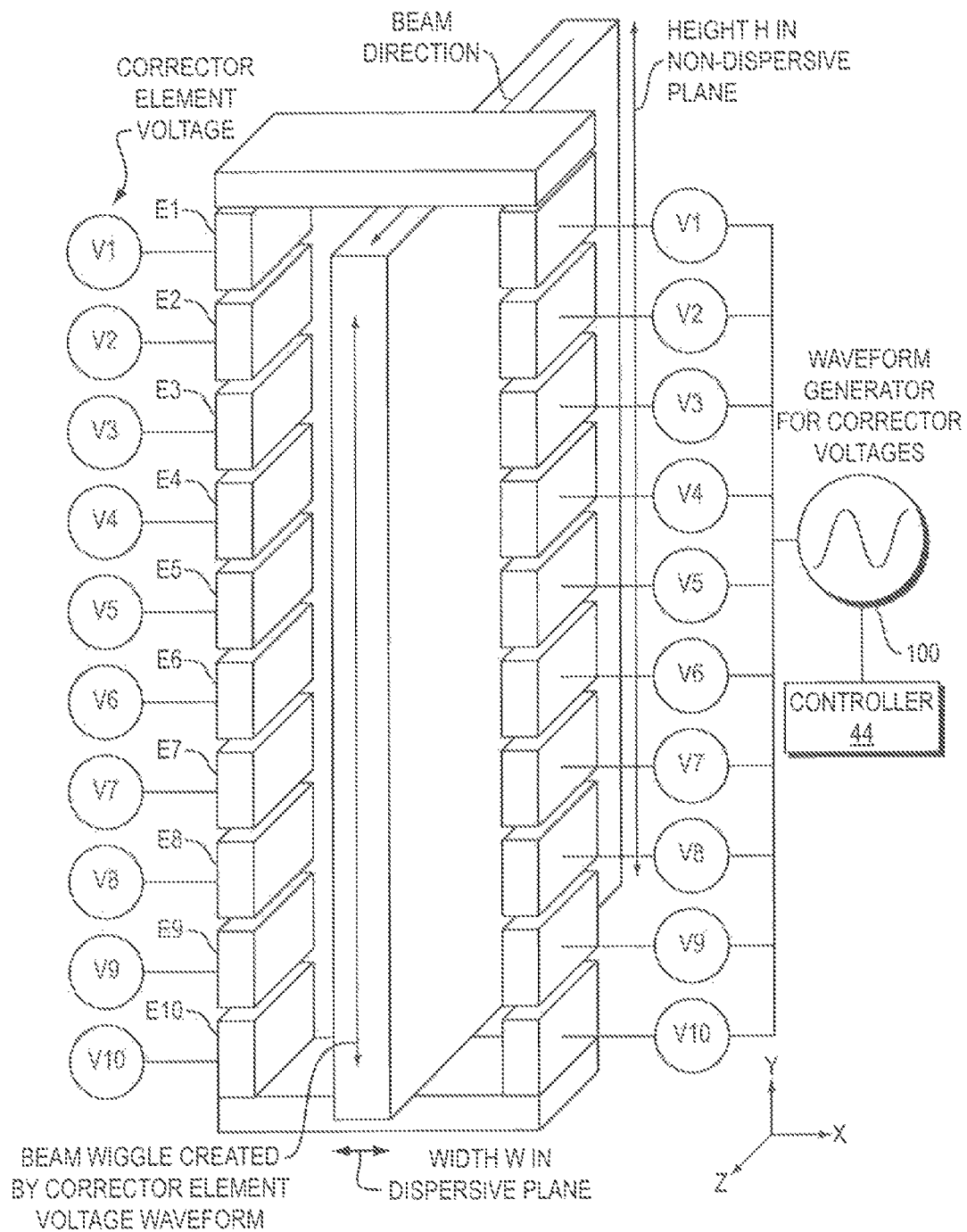

With reference to FIG. 8A, in some embodiments, the corrector device 42 can be configured to cause an oscillating motion of the ion beam along its longitudinal dimension. A waveform generator 100 under the control of the controller 44 can apply varying voltages to one or more of the electrode pairs to cause a varying electric field with components along the longitudinal dimension of the beam (along the y-axis), which can in turn cause time-varying deflection of the beam. In some cases, such time-varying deflection of the ion beam can be in the form of periodic oscillation of the beam along its longitudinal dimension. In some cases, the amplitude of such an oscillation can be, e.g., in a range of about 10 mm to about 20 mm.

By way of example, the waveform generator can apply a triangular voltage waveform to the electrode pairs E1, ..., E10, as shown schematically in FIG. 8B, to cause a periodic oscillation of the beam along its longitudinal axis. Such "wiggling" of the ion beam can improve the dose uniformity of the ions implanted into a substrate on which the beam is incident. The frequency of the oscillations can vary based, e.g., on the rate the substrate is moved relative to the incident ion beam. In some embodiments, the oscillation frequency can be, e.g., in a range of about 1 Hz to about 1 kHz.

Referring again to FIGS. 2A, 2B and 2C, the deceleration/acceleration system 22 further includes a deceleration/acceleration element 46 that is separated from a downstream focusing element 48 to define a gap region 50 therebetween. The deceleration/acceleration element 46 comprises two opposed equipotential electrodes 46a and 46b that provide a channel therebetween for passage of the ion beam. Similarly, the focusing element 48 includes two equipotential opposed electrodes 48a and 48b that provide a channel therebetween for the passage of the ion beam.

The application of an electric potential difference between the deceleration/acceleration element 46 and the focusing element 48 generates an electric field in the gap region 50 for decelerating or accelerating ions of the beam. The potential difference between the deceleration/acceleration element and the focusing element can be selected based on a desired change in the energy of the ions, the types of ions of the ion beam, a particular application for which the ion beam is utilized, among other factors, in a manner known to those having ordinary skill in the art.

By way of example, in some implementations, an electric voltage in a range of about 0 to about −30 (minus 30) kV, or in a range of about 0 to about +30 kV, can be applied to the deceleration/acceleration electrodes 46a/46b and an electric voltage in a range of about 0 to −5 (minus 5) kV can be applied to the focusing electrodes 48a/48b.

With reference to FIG. 2C, in this embodiment, an upstream face (UF) of one or both of the focusing electrodes 48a/48b is curved so as to generate electric field components in the gap region for countering divergence of the ion beam in the non-dispersive plane (e.g., along the longitudinal dimension of the beam). By way of illustration, FIG. 2C shows an ion beam passing through the gap 50, which due to repulsive space charge effects, exhibits divergence of ions in proximity of its longitudinal end points in the non-dispersive plane. The curved profiles of the upstream ends of the focusing electrodes 48a/48b can be configured to facilitate generating an electric field pattern that would apply corrective forces to such diverging ions to ensure substantially parallel propagation of the ions of the beam. By way of example, the upstream end of the focusing electrode can have a generally concave profile (when viewed from the upstream direction) with a radius of curvature in a range of about 1 m to about 10 m.

Referring again to FIGS. 2A, 2B and 2C, the deceleration/acceleration system 22 further includes an electrostatic bend 52 that is disposed downstream of the focusing element 48 and is separated therefrom by a gap 53. A potential difference between the focusing element 48 and the electrostatic bend, e.g., one or more electrodes of the bend, can generate an electric field in the gap 53 for reducing divergence of the ribbon ion beam along a transverse dimension thereof. In other words, the gap between the focusing element 48 and the electrostatic bend 52 functions as a focusing lens for reducing divergence of the ion beam along its transverse dimension. One or more voltage sources can be used to apply voltages to the deceleration/acceleration element, and the focusing element, e.g., under the control of the aforementioned controller 44, in a manner known in the art.

In this embodiment, the electrostatic bend 52 includes an outer electrode 52a, and an opposed inner electrode 52b to which different electric potentials can be applied to cause a deflection of the ion beam as it passes through the transverse gap separating these electrodes. By way of example, the deflection angle of the ion beam can be in a range of about 10 degrees to about 90 degrees, e.g., 22.5 degrees.

In this embodiment, the electrostatic bend further includes an intermediate electrode 52c, which is disposed downstream of the inner electrode 52b and is electrically isolated therefrom (e.g., via a gap) to allow application of a voltage thereto that is independent of that applied to the inner electrode 52b. By way of example, in this embodiment, the outer electrode 52a and the intermediate electrode 52c are held at the same electric potential. In some embodiments, a voltage applied to the outer electrode 52a can be in a range of about 0 to about −20 (minus 20) kV and the voltage applied to the inner electrode 52b can be in a range of about −5 (minus 5) kV to about −30 (minus 30) kV.

The outer electrode 52a includes an upstream portion (UP) and a downstream portion (DP) disposed at an acute angle relative to one another to impart a bent profile to the outer electrode. The angle between the upstream and the downstream portions of the outer electrode can be selected based, e.g., on geometrical constraints, the transverse divergence of the beam as it enters the deceleration/acceleration system, among others. In this embodiment, the angle between the upstream and the downstream portions of the outer electrode is about 22.5 degrees. While in this embodiment the upstream and the downstream portions integrally form the outer electrode, in another embodiment the upstream and the downstream portions can be separate electrodes that are electrically coupled to be equipotential.

As noted above, a potential difference between the outer electrode 52a and the inner electrode 52b generates an electric field in the space between those electrodes for deflecting the ions of the beam. The electrically neutral species (neutral atoms and/or molecules) present in the ion beam, if any, are not, however, deflected and continue to propagate along their propagation direction as they had entered the electrostatic beam. Consequently, these neutral species, or at least a portion thereof, strike the downstream portion (DP) of the outer electrode and are removed from the ion beam.

Another corrector device 54 for adjusting the current density of the ion beam along its longitudinal dimension (in the non-dispersive plane) can be optionally disposed downstream of the electrostatic bend 52. In this embodiment, the corrector device 54 has a structure similar to that of the upstream corrector device 42. In particular, the corrector device 54 includes a plurality of spaced electrode pairs, such as the electrode pairs depicted in FIG. 5 in connection with the upstream corrector device 42, which are stacked along the longitudinal dimension of the beam with each electrode pair providing a transverse gap therebetween for passage of the ion beam. Similar to the upstream corrector device 42, each electrode pair of the second corrector device 54 can be individually biasable via application of a voltage thereto, e.g., via a plurality of voltages sources similar to the voltage sources V1, . . . , V10 depicted in FIG. 5 in connection with the corrector device 42. In this manner, the second corrector device 54 can locally deflect one or more portions of the ion beam, if needed, to further improve the uniformity of the current density of the ion beam along its longitudinal dimension. In this manner, the two corrector devices 42 and 54 cooperatively ensure that the ribbon ion beam exiting the deceleration/acceleration system 22 exhibits a high degree of current density uniformity along its longitudinal dimension.

The controller 44 discussed above is also in communication with the voltage sources applying voltages to the electrode pairs of the second corrector device 54. The controller can determine the voltages to be applied to the electrode pairs, e.g., in a manner discussed in more detail below, and can cause the voltage sources to apply those voltages to the electrode pairs.

Similar to the upstream corrector device 42, the second downstream corrector device 54 can be configured to cause a transverse deflection of the beam and/or an oscillating motion of the beam along its longitudinal dimension in a manner discussed above. Further, the downstream corrector device 54 can also be configured to cause a longitudinal (vertical) deflection of the entire beam, e.g., in a manner discussed above in connection with the upstream corrector device 42.

As noted above, in this embodiment, the outer electrode 52a and the intermediate electrode 52c are held at the same potential This can ameliorate, and preferably prevent, any disturbance of the ion beam due to undesired components of the electric field as it passes through the gap between the electrostatic bend and the second corrector device.

In this embodiment, the electrode pairs of the downstream second corrector device 54 are staggered along the longitudinal dimension of the ion beam relative to the electrode pairs of the upstream corrector device 42. In other words, each electrode pair of the corrector device 54 is offset vertically (i.e., along the longitudinal dimension of the ion beam) relative to a respective electrode pair of the upstream corrector device 42. Such an offset can be, e.g., half of the longitudinal height of the electrodes of the corrector devices (half the pixel size). In this manner, the corrector device 42 and 54 can cause local deflection of the various portions of the ion beam at a finer resolution, e.g., a resolution corresponding to half the pixel size.

In this embodiment, the corrector devices 42 and 54 are well separated from one another to limit the voltages applied to their electrode pairs to less than about 2 kV, which can improve the stability of operation of the corrector devices and can also allow close packing of the electrode pairs along the longitudinal dimension.

While in this embodiment two corrector devices are employed, in other embodiments only a single corrector device can be employed to improve the uniformity of the current density of the ion beam along its longitudinal dimension, e.g., either the corrector device 42 or the corrector device 54 can be utilized. For example, in some embodiments in which the ion beam received from the analyzer magnet is decelerated, only the downstream corrector device 54 may be employed.

With continued reference to FIG. 2A as well as FIGS. 2B and 2C, another focusing element 56 is optionally disposed downstream of the second corrector device 54 and is separated therefrom by a gap 58. Similar to the upstream focusing element 48, the second focusing element 56 includes a pair of opposed electrodes 56a and 56b that provide a channel therebetween for the passage of the ion beam. An electric potential difference between one or more electrode pairs of the second corrector device 54 and the second focusing electrodes 56a/56b can result in an electric field within the gap 58, which can reduce divergence of the ion beam along its transverse dimension as the beam passes through the gap.

In some embodiments, the voltage applied to the focusing electrode 56a and 56b can be in a range of about 0 to about −10 (minus 10) kV.

The system further includes a grounded element 60, which has a pair of opposed electrically grounded electrodes 60a and 60b that are disposed downstream of the second focusing electrodes 56a and 56b and are separated therefrom to form a gap 62. The opposed grounded electrodes 60a and 60b form an electrically grounded duct through which the ion beam exits the deceleration/acceleration system toward the end station 24.

In some embodiments, the deceleration/acceleration system 22 lacks the second corrector device 54 and the second focusing element 58.

The electrical potential difference between the focusing electrodes 56a and 56b and the grounded electrodes 60a and 60b results in the generation of electric field components within the gap 62, which can reduce divergence of the ion beam along its transverse dimension as the ion beam passes through the gap. Further, in this embodiment, the upstream faces (edges) of the electrodes 60a and 60b are curved, e.g., similar to the upstream faces (edges) of the electrodes 48a/48b, to reduce divergence of the beam along its longitudinal dimension. Hence the lens gaps 58 and 62 collectively provide a second focusing lens for reducing divergence of the ion beam along its transverse and longitudinal dimensions.

In many embodiments, the output ribbon ion beam that exits the deceleration/acceleration system exhibits a current density profile along its longitudinal dimension with an RMS non-uniformity of equal to or less than about 5%, or equal to or less than about 4%, or equal to or less than about 2%, and preferably less than about 1%. Such a ribbon beam can have a longitudinal length that is greater than a diameter of a substrate on which it is incident (e.g., greater than about 300 mm or greater than about 450 mm). Thus, a linear motion of the substrate along a transverse dimension can result in implantation of a substantially uniform dose of ions in the substrate.

In some embodiments, the output ribbon ion beam can be employed to implant an ion dose in a range of about $10^{12}$ to about $10^{16}$ cm$^{-2}$ in a substrate. In some such embodiments, the current of the ribbon ion beam incident on the substrate can be, e.g., in a range of about a few tens of microamperes (e.g., about 20 microamperes) to about a few tens of milliamperes (e.g., about 60 milliamperes), e.g., in a range of about 50 microamperes to about 50 milliamperes or in a range of about 2 milliamperes to about 50 milliamperes.

In some embodiments, the voltages applied to the corrector devices 42 and 54 can be determined in the following manner. The current density of the ribbon mass-selected ion beam exiting the analyzer magnet 20 (herein also referred to as the uncorrected ion beam) can be initially measured. This can be achieved, e.g., by passing the uncorrected ion beam through the deceleration/acceleration system 22 with voltages applied only to the electrodes of the electrostatic bend to steer the beam substantially undisturbed to the end-station.

Figure 9:
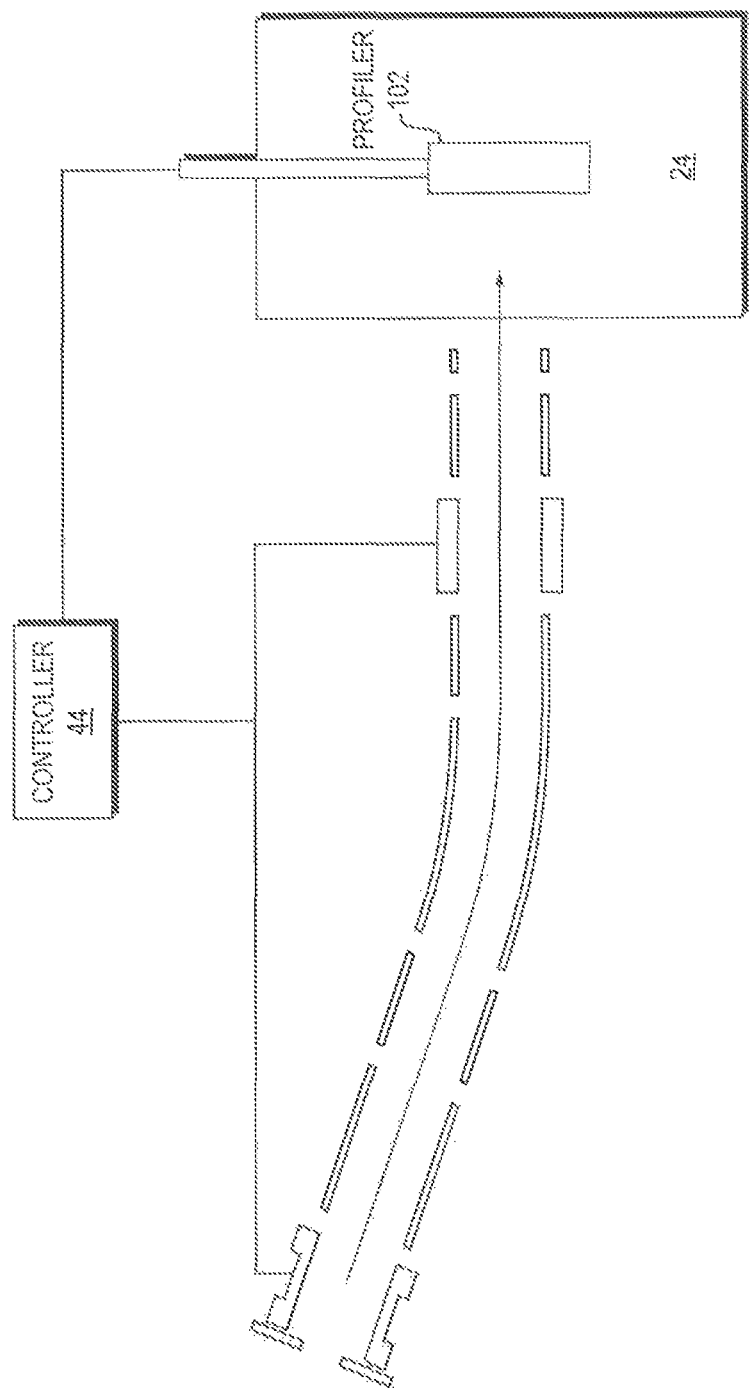
FIG. 9 is a partial schematic view of the ion implantation system shown in FIGS. 2A, 2B, and 2C, further depicting a beam profiler for measuring a current profile of a beam.

A current measuring device disposed in the end-station can be utilized to measure the current density profile of the uncorrected ion beam. By way of example, FIG. 9 schematically depicts a profiler 102 retractably disposed in the end station 24 of the ion implantation system. A variety of beam current profilers can be employed. For example, in some embodiments, the beam current profiler can include an array of Faraday cups to measure the current profile of the beam as a function of height. In other embodiments, the beam profiler can include a current-measuring plate that can be moved across the beam. The beam profiler is in communication with the controller 44 to provide information regarding the current profile of the beam along its longitudinal dimension. The controller 44 can employ this information to determine the requisite voltages to be applied to the corrector devices and/or other elements (e.g., focusing elements). For example, the controller can employ this information to determine the voltages to be applied to the electrode pairs of the corrector devices to improve the uniformity of the ion beam's current density profile along its longitudinal dimension.

Figure 10A:
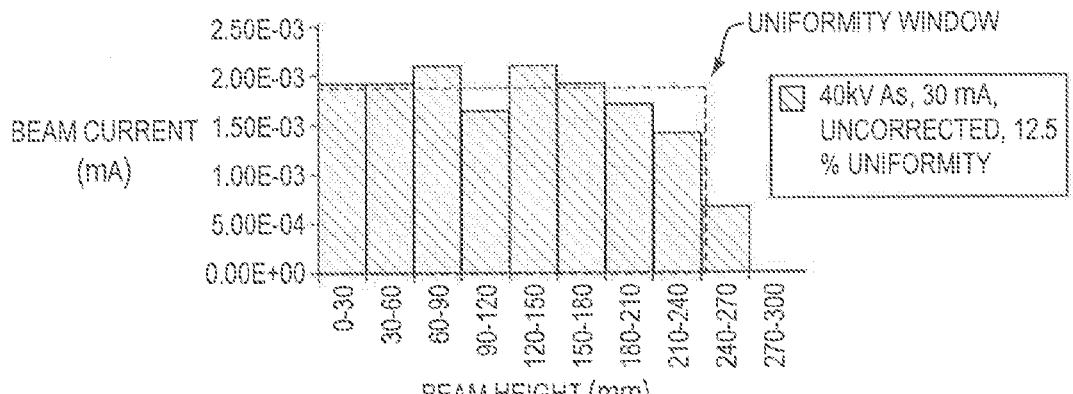
FIG. 10A depicts a simulated current profile of uncorrected ribbon ion beam as a function of height.

By way of example, FIG. 10A shows a histogram depicting ion current of a simulated uncorrected phosphorous ion beam having an energy of 40 keV and a total current of 30 mA in a number of height bins. This histogram shows localized non-uniformity of the current density of the ion beam relative to a uniformity window. In this example, the uncorrected beam exhibits an RMS variation of about 12.7% in the ion current in different height bins.

Referring again to FIG. 9, the controller 44 can receive the information regarding the current density profile of the uncorrected beam (e.g., the information depicted in above histogram) from the beam profiler 102 and can utilize that information to determine the voltages to be applied to the electrode pairs of one of the corrector devices (e.g., in the example described in connection with FIGS. 10A, 10B, and 10C the downstream corrector device 54 was initially configured) to provide a first correction of the current density of the ion beam along its longitudinal dimension.

In some embodiments, the controller can compare the measured current in each height window with a reference value. If the difference between the measured current and the reference value exceeds a threshold, e.g., 1 or 2 percent, the controller can effect one or more voltage sources to apply voltages to one or more electrode pairs between which the beam portion corresponding to that height window passes so as to bring the current in that portion closer to the reference value. As discussed in detail above, this can be achieved by causing local deflection(s) of the beam along its longitudinal dimension.

Figure 10B:
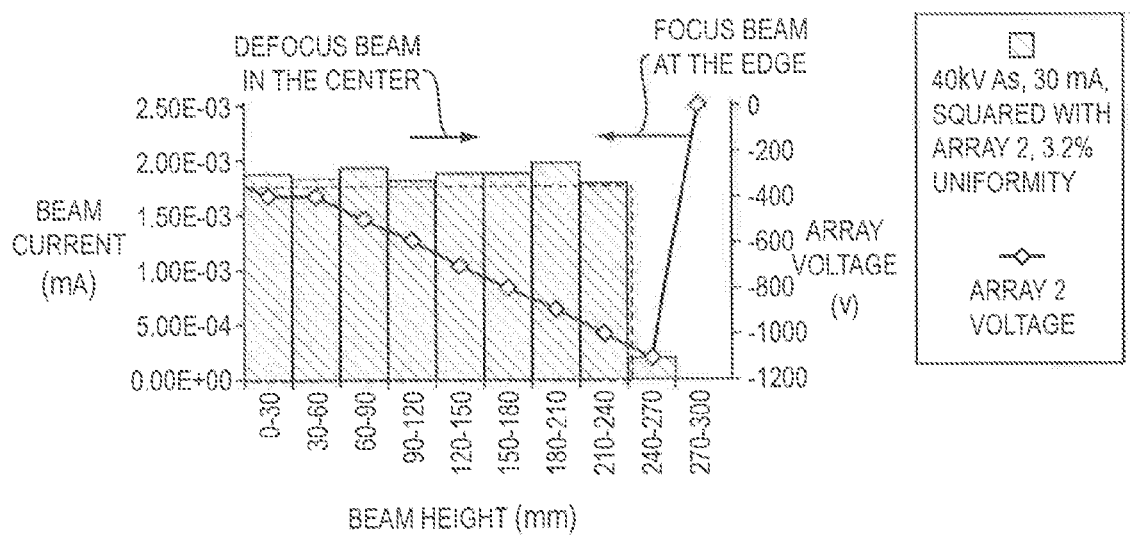
FIG. 10B shows exemplary voltages that can be applied to the electrode pairs of one of the corrective devices of the ion implantation system shown in FIGS. 2A, 2B, and 2C to provide a coarse correction of the beam profile shown in FIG. 10A, as well as the simulated profile of a partially corrected beam obtained via such coarse correction.

By way of example, the controller can cause the voltage sources coupled to the electrode pairs of the second corrector device 54 to apply the voltages shown in FIG. 10B to the electrode pairs in order to defocus the ion beam at its center and to focus the beam at its upper edge. For example, voltages can be applied to the electrodes between which the portion of the ion beam corresponding to the 60-90 mm height window passes to lower the current density in this portion. In this manner, the uniformity of the current density of the beam can be improved.

The current density profile of the partially corrected ion beam subject to the correction by one of the corrector devices (e.g., in this example the downstream corrector device) can then be measured, e.g., in a manner discussed above in correction with measuring the current density of the uncorrected ion beam.

By way of example, the histogram shown in FIG. 10B depicts the simulated ion current as function of height windows along the longitudinal dimension of an ion beam obtained by using only the second corrector device to improve the current density of the uncorrected beam shown above in FIG. 10A. This partially corrected ion beam exhibits an RMS deviation of the beam current of about 3.2% within the uniformity window (an improvement relative to the 12.5% variation exhibited by the uncorrected beam).

Referring again to FIG. 9, the controller 44 can receive the information regarding the current density profile of the partially corrected ion beam to determine voltages to be applied to the electrode pairs of the upstream corrector device 42 to further enhance the uniformity of the beam profile. In other words, the upstream corrector device can provide a fine correction of the beam profile.

Figure 10C:
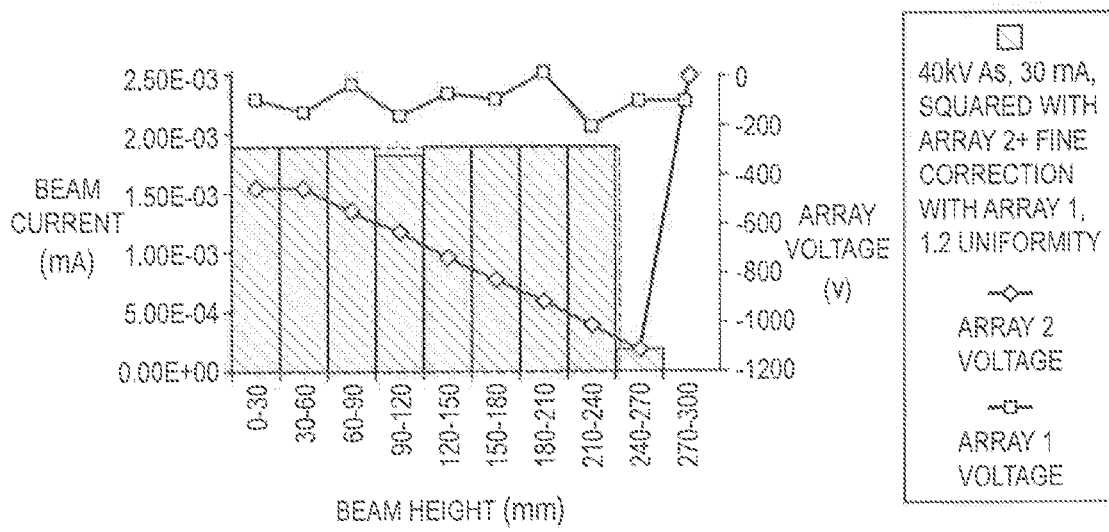
FIG. 10C shows exemplary voltages that can applied to the electrode pairs of another corrector device of the ion implantation system shown in FIGS. 2A, 2B, and 2C to improve the uniformity of the partially corrected beam depicted in FIG. 10B, as well as the simulated profile a corrected beam obtained in this manner, FIG. 11A schematically depicts an ion implantation system according to an embodiment in which an electrostatic bend composed of three electrode pairs is employed.

By way of example, FIG. 10C shows the voltages that can be applied to the first corrector device 42 to further enhance the uniformity of the beam profile within the uniformity window. This figure also presents a histogram that depicts the simulated profile of the ion beam's current when both the first and the second corrected devices 42 and 54 are employed to correct the non-uniformities of the uncorrected beam whose profile is depicted in FIG. 10A. This histogram shows that the combined corrective effects of the two corrector devices result in current density profile with an RMS deviation of the ion current within the uniformity window of about 1.2%. In other words, in this example, the combined corrective effects of the two corrector devices result in about an order of magnitude improvement in the uniformity of the ion beam's current density profile along the longitudinal dimension.

In other embodiments, the upstream corrector device 42 can first be configured to provide a coarse correction of the current density profile of the ribbon beam exiting the mass analyzer and the downstream corrector device 54 can then be configured to provide a finer correction of the beam's current density profile.

As discussed above, the deceleration/acceleration system 22 can be configured in a variety of different ways. By way of example, in some embodiments, the deceleration/acceleration voltages can be set to zero such that the system 22 functions only as a corrective system without causing acceleration and/or deceleration of the ions in the beam.

An ion implantation system according to the present teachings can be employed to implant a variety of ions in a variety of substrates. Some examples of ions include, without limitation, phosphorous, arsenic, boron, molecular ions, such as $BF_2^+$, $B_{18}H_x^+$ and $C_7HN_x^+$. Some examples of substrates include, without limitation, silicon, germanium, epitaxial (such as polysilicon-coated) wafers, silicon-on-insulator (SIMOX) wafers, ceramic substrates such as SiC or SiN, solar cells, and substrates used in producing flat panel displays. Some examples of substrate shape include circle, square or rectangle.

In some embodiments, an electrostatic bend can be implemented by employing three pairs of tandem electrodes disposed downstream of an acceleration/deceleration system. As discussed in more detail below, such an implementation of the electrostatic bend can be particularly advantageous when the acceleration/deceleration system is operated in a deceleration mode to decelerate a received ion beam at a deceleration ratio of at least 2, e.g., at a deceleration ratio in a range of about 5 to about 100. The term deceleration ratio as used herein refers to a ratio of the energy of an ion beam entering the deceleration system relative to the energy of the ion beam exiting the deceleration system (i.e., the ratio of the ion beam received by the deceleration system relative to the energy of the decelerated ion beam).

Figure 11A:
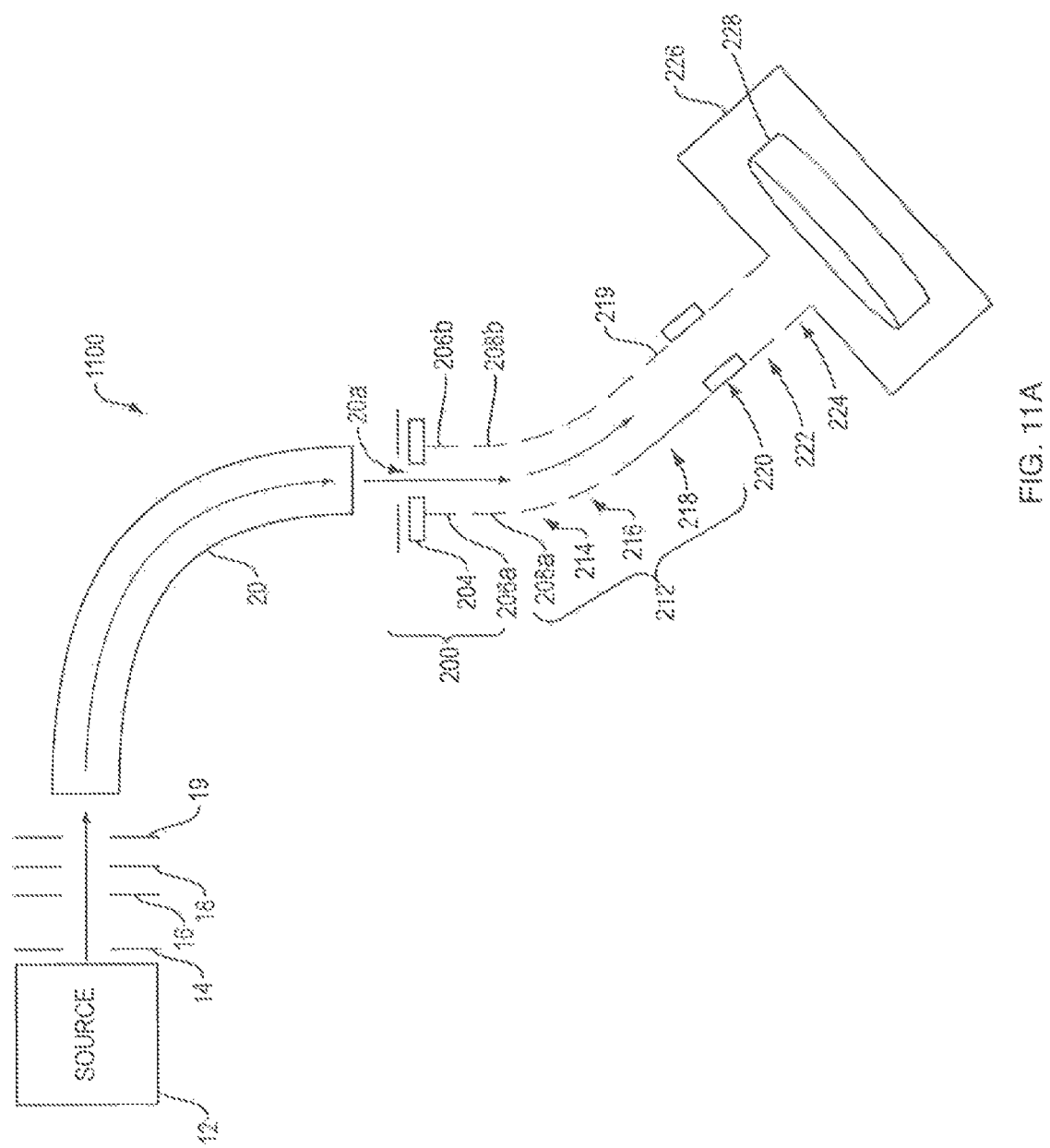
FIG. 11B is a schematic partial view of the ion implantation system depicted in FIG. 11A in dispersive plane.
FIG. 11C is a different schematic partial view of the ion implantation system depicted in FIG. 11A in non-dispersive plane, FIG. 11D schematically depicts voltage sources for applying voltages to the electrodes of the electrostatic bend and a controller for controlling the voltage sources.
Figure 11B:
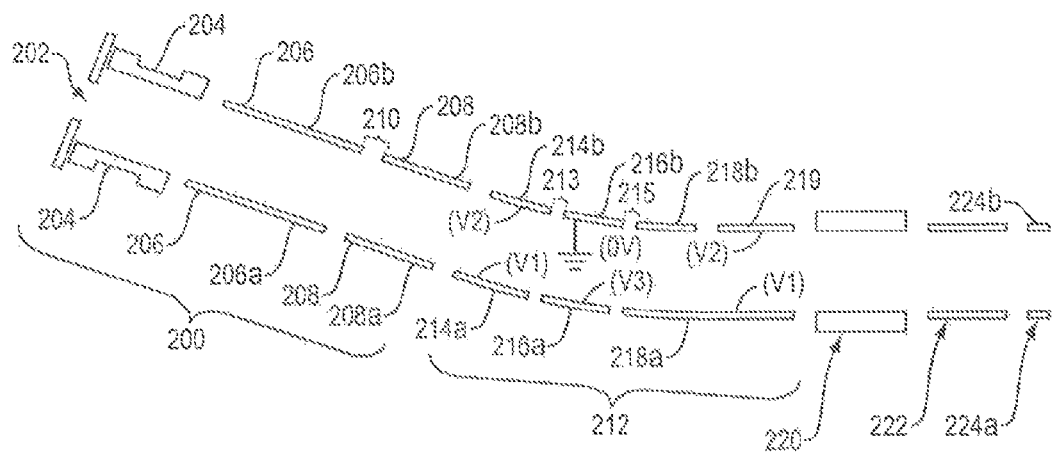
Figure 11C:
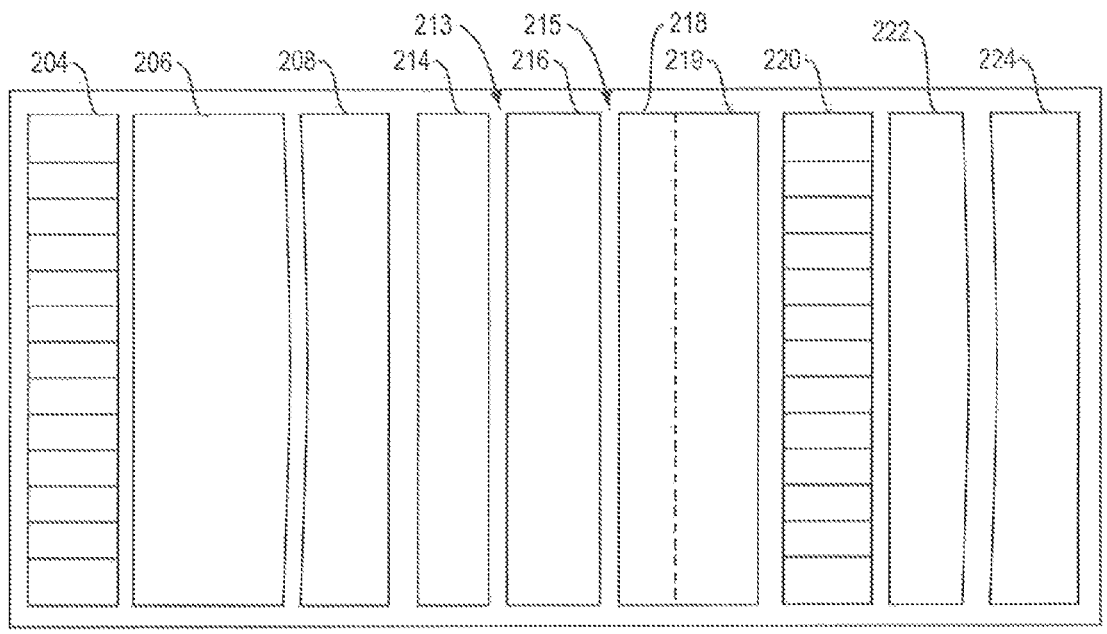

FIGS. 11A, 11B and 11C schematically depict an ion implantation system 1100 according to such an embodiment. The ion implantation system 1100 is similar to the ion implantation system 10 discussed above in connection with FIGS. 2A, 2B and 2C except for the implementation of the electrostatic bend as three pairs of electrostatically biased electrodes as discussed in more detail below. More specifically, similar to the above ion implantation system 10, the ion implantation system 1100 includes the ion source 12 for generating an ion beam, the puller electrode 14 that is electrically biased to facilitate extraction of the ion beam from the source, the suppression electrode 16 that is electrically biased to inhibit back streaming of neutralizing electrons, the focus electrode 18 that is electrically biased to reduce the divergence of the ion beam, and the ground electrode 19 that defines the reference ground for the ion beam. The analyzer magnet 20 is disposed downstream of the focus electrode 18 to receive the ribbon ion beam and generate a mass-selected ion beam.

The ion implantation system 1100 further includes a deceleration/acceleration system 200, which includes a slot 202 for receiving the mass-selected ion beam, and a corrector device 204, similar to the corrector devices discussed above. The deceleration/acceleration system 200 further includes a deceleration/acceleration element 206 that is separated from a downstream focusing element 208 to define a gap 210 therebetween. As discussed above in connection with the ion implantation system 10, the deceleration/acceleration element 206 includes two opposed equipotential electrode portions 206a and 206b that provide a channel therebetween for passage of the ion beam. In this embodiment, the electrode portions 206a and 206b are connected at their top and bottom ends to form a rectangular electrode. Similarly, the focusing element 208 includes two equipotential electrode portions 208a and 208b that provide a channel therebetween for the passage of the ion beam.

The application of an electric potential difference between the deceleration/acceleration element 206 and the focusing element 208 generates an electric field in the gap region 210 for decelerating or accelerating the ion beam. In this embodiment, when operating in the deceleration mode, the electric potentials applied between the deceleration/acceleration element 206 and the focusing element 208 can cause a deceleration of the ion beam passing through the gap 210 at a deceleration ratio of at least 2, e.g., in a range of about 5 to about 100. By way of example, to achieve such a deceleration ratio, an electric voltage in a range of about −5 kV to about −60 kV can be applied to the electrode portions 206a and 206b of the acceleration/deceleration element 206 and an electric voltage in a range of about 0 V to about −30 kV (minus 30 kV) can be applied to the electrode portions 208a and 208b of the focusing element 208.

In this embodiment, an electrostatic bend 212 (herein also referred to as E-bend 212) comprising three electrode pairs (214, 216, and 218) is disposed downstream of the focusing element 208 to receive and deflect the ion beam. The electrically neutral species (neutral atoms and/or molecules) present in the ion beam, if any, are not, however, deflected and continue to propagate along their propagation direction as they had entered the electrostatic bend. Similar to the previous embodiments, the electrostatic bend can deflect the ion beam at an angle in a range of about 10 degrees to about 90 degrees, e.g., 22.5 degrees.

The first electrode pair 214 includes an inner electrode 214b and an outer electrode 214a spaced apart to allow passage of the ion beam therebetween. The second electrode pair 216 also includes an inner electrode 216b and an outer electrode 216a that are spaced apart to allow passage of the ion beam therethrough. Similarly, the end electrode pair 218 includes an inner electrode 218b and an outer electrode 218a that are spaced apart to allow passage of the ion beam therethrough. Each electrode of the second electrode pair is disposed at an angle, e.g., half of the full deflection angle of the ion beam, such as a deflection angle in a range of about 5 degrees to about 45 degrees, relative to the respective electrode of the first and the end electrode pairs.

As discussed in more detail below, the electrodes of the first electrode pair 214 are held at an electric potential that is lower than the electric potential at which the electrodes of the second electrode pair 216 are held. Further, each of the electrodes of the end electrode pair 218 is held at an electric potential less than an electric potential at which any of the electrodes of the second electrode pair 216 is held. Further, in this embodiment in which the ion beam includes positively charged ions, the inner electrode of each of the electrode pairs is held at an electric potential that is less than an electric potential at which a respective outer electrode of that electrode pair is held so as to generate an electric field for bending the ion beam as it passes through the space between the electrodes. In other words, the inner electrode 214b is held at a lower electric potential than the outer electrode 214a, the inner electrode 216b is held at a lower electric potential than the outer electrode 216a, and the inner electrode 218b is held at a lower electric potential than the outer electrode 218a.

More specifically, with reference to FIG. 11B, in this embodiment the outer electrode 214a of the first electrode pair 214 and the outer electrode 218a of the end electrode pair 218 are held at the same potential ($V_1$) and the inner electrode 214b of the first electrode pair 214 and the inner electrode 218b of the end electrode pair 218 are held at the same potential ($V_2$), where $V_2$ is less than $V_1$ (e.g., $V_2$ can be −25 kV and $V_1$ can be −15 kV). Further, the inner electrode 216b of the second electrode pair 216 is electrically grounded and the outer electrode 216a of the second electrode pair is held at a potential $V_3$, where $V_3$ is greater than each of $V_1$ and $V_2$.

By way of example, the electric potential $V_1$ can be in a range of 0 V (zero volt) to about −20 kV, and the electric potential $V_2$ can be in a range of 0 V (zero volt) to about −30 kV. Further, the electric potential $V_3$ can be in a range of about 0 to about +30 kV.

Figure 11D:
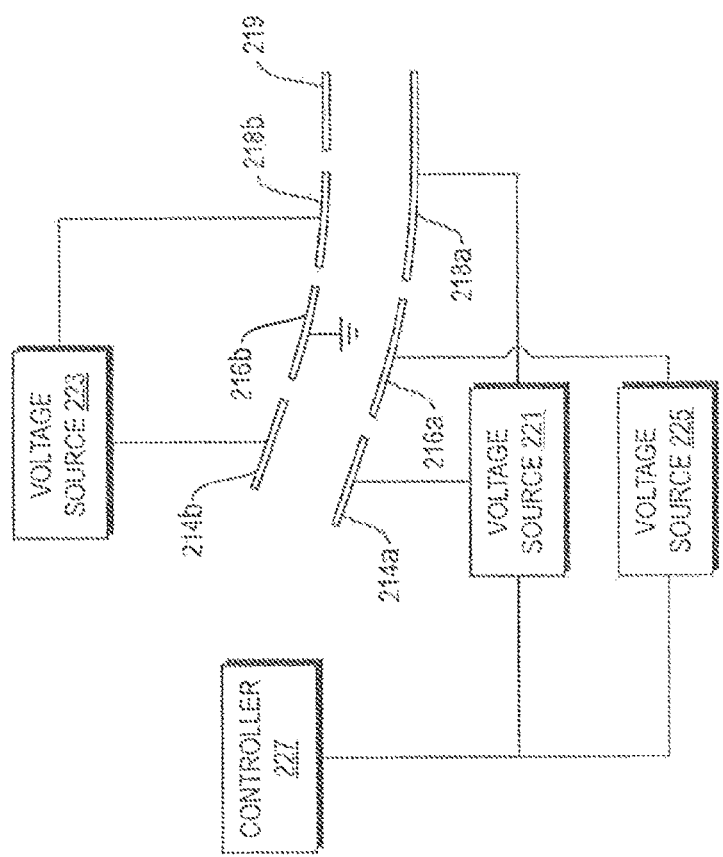

With reference to FIG. 11D, in this embodiment, a voltage source 221 applies the voltage $V_1$ to the electrodes 214a and 218a, a voltage source 223 applies the voltage $V_2$ to the electrodes 214b and 218b, and a voltage source 225 applies the voltage $V_3$ to the electrode 216a. In other embodiments, the voltage sources can apply a different pattern of voltages to the electrodes. A controller 227 can control the voltage sources for application of desired voltages to the electrodes.

The arrangement of the three electrode pairs (214, 216, and 218) can provide advantages when used downstream of a deceleration system in an ion beam line as discussed herein. In particular, when the deceleration system is operated so as to provide a high deceleration ratio, e.g., a deceleration ratio greater than about 2, the ion beam can be subjected to a strong focusing effect as it traverses the deceleration gap (e.g., the gap 210 discussed above). Such strong focusing can create an over-focused beam, which may exhibit significant divergence ("blow-up") as it traverses a downstream electrostatic bend and hence strike the electrodes of the bend or those of other downstream components.

The use of the segmented electrode pairs 214, 216, and 218 as the electrostatic bend can alleviate this problem. More specifically, the segmented electrode pairs 214, 216, and 218 can exhibit a strong focusing power to correct for the high divergence of the beam caused by strong focusing of the beam by the deceleration system so as to ensure that the beam will exit the electrostatic bend and reach the downstream wafer without any significant loss, and preferably without any loss, of the ions to the electrodes of the bend or those of other downstream components. For example, the ion beam may be defocused as it enters a gap 213 between the first and the second electrode pairs. The ion beam can experience a strong focusing force as it enters into the space between the electrodes of the second electrode pair 216 and a gap 215 between the second electrode pair and the end electrode pair, though in some cases the beam can experience a small defocusing force in the gap 215.

Figure 12A:
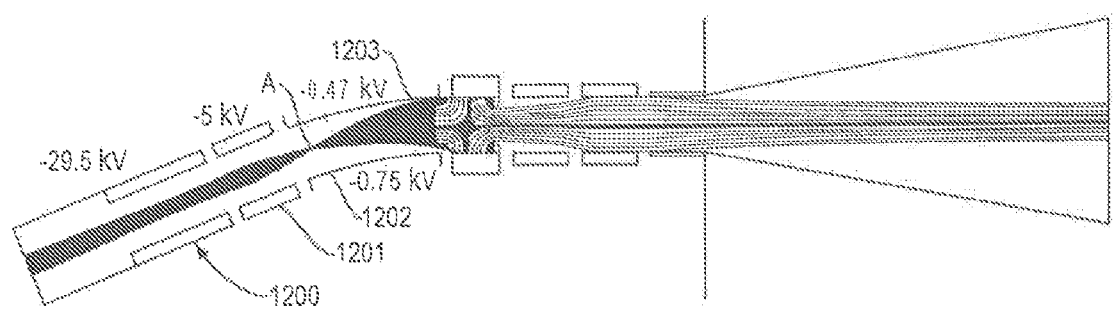
FIG. 12A shows theoretical simulation results for an ion beam passing through a deceleration system operating at a deceleration ratio of 60 and a downstream E-bend formed of two spaced-apart electrodes.

By way of further illustration, FIG. 12A shows theoretical simulation of the passage of an ion beam through a deceleration system and a downstream conventional electrostatic bend formed of two spaced apart electrodes. Specifically, in this simulation, the deceleration system includes two electrode pairs 1200 and 1201, where the electrode pair 1200 is maintained at a voltage of −29.5 kV and the electrode pair 1201 is maintained at a voltage of −5 kV. Further, the inner electrode 1202 of the electrostatic bend is maintained at a voltage of −0.75 kV and the outer electrode 1203 of the electrostatic bend is maintained at a voltage of −0.47 kV. Further, the beam entering the deceleration system was assumed to include positively charged ions at an energy of 30 keV. The passage of the ion beam through the deceleration system reduced the beam's energy to 0.5 keV. In other words, the deceleration system exhibited a deceleration ratio of 60. The simulation results show that this high deceleration ratio resulted in over-focusing of the beam at the focus A such that the beam exhibits a cross-over and hence diverges sufficiently fast to strike the outer electrode of the electrostatic bend at its distal end as well as downstream components.

Figure 12B:
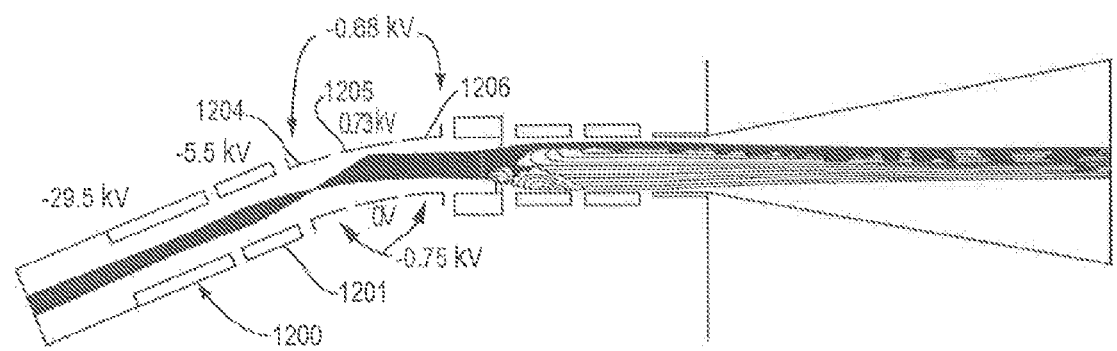
FIG. 12B shows theoretical simulation results for an ion beam passing through a deceleration system operating at a deceleration ratio of 60 and a downstream E-bend composed of three electrode pairs.

In contrast, FIG. 12B shows theoretical simulation results of the passage of the ion beam through a deceleration system followed by an electrostatic bend implemented with three separate electrode pairs. Similar to the previous simulation, the deceleration system consists of the two electrode pairs 1200 and 1201 held respectively, at a voltage of −29.5 kV and −5.5 kV. In this simulation, the electrostatic bend is implemented by employing three electrode pairs 1204, 1205, and 1206, in a manner discussed above, where the inner electrodes of the first and the end electrode pairs 1204 and 1206 are held at an electric potential of −0.75 kV and their outer electrodes are held at an electric potential of −0.68 kV. The inner electrode of the second electrode pair is grounded and its outer electrode is held at an electric potential of +0.73 kV. Similar to the previous simulation, the ion beam entered the deceleration system with an energy of 30 keV and exited the deceleration system with a reduced energy of 0.5 keV (corresponding to a deceleration ratio of 60). Although similar to the previous simulation the high deceleration ratio resulted in over focusing of the ion beam and hence its divergence as it entered the electrostatic bend, the electrostatic bend of the present teachings corrects for this divergence to ensure that the beam would exit the bend as well as the downstream components without ion loss, e.g., to the electrodes of the bend or those of the downstream components.

Another advantage of the electrostatic bend implemented by using three electrode pairs as discussed above is that it can help with focusing of a high-current ion beam. In E-bends in which high voltages are applied to the bend's electrodes, there is typically a paucity of background electrons within the bend. The lack of such electrons renders charge neutralization of the beam, which can inhibit beam "blow-up," difficult.

In particular, in conventional E-bends the problem of beam "blow-up" can be pronounced for high beam energies, e.g., for energies greater than about 30 keV, and high beam currents as the required voltages for providing such E-bends with sufficient focusing power can be very high (e.g., −30 kV to −60 kV).

Figure 13A:
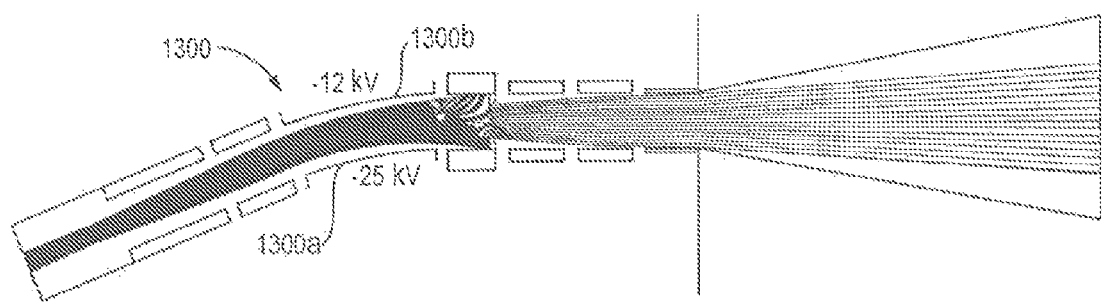
FIG. 13A shows theoretical simulation results for an As ion beam having an energy of 30 keV and a current of 25 mA passing through an E-bend consisting of two spaced apart electrodes.

For example, FIG. 13A shows a simulated ion beam having an energy of 30 keV and a current of 25 mA passing through a conventional E-bend 1300 having an inner electrode 1300a that is maintained at an electric potential of −25 kV and an outer electrode 1300b that is maintained at an electric potential of −12 kV. The beam's width on a downstream wafer was 169 mm. The simulation results show that the "blow-up" of the beam leads to ion loss as well as a wider beam spot on the downstream wafer, which would necessitate larger over scan of the wafer and would lower the process throughput.

Figure 13B:
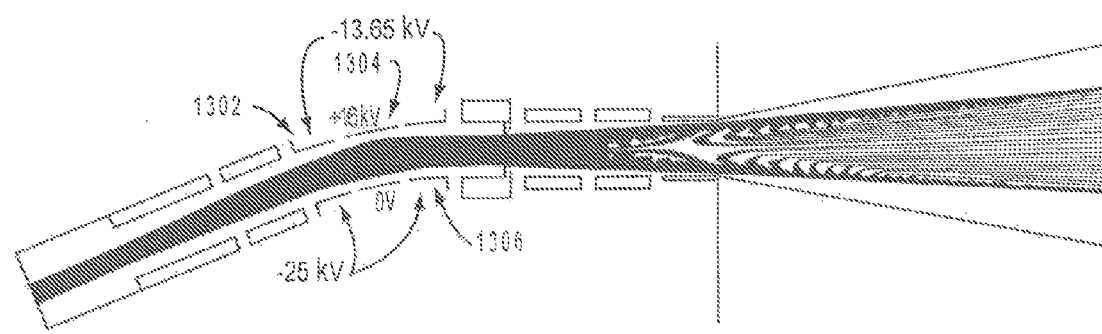
FIG. 13B shows theoretical simulation results for an As ion beam having an energy of 30 keV and a current of 25 mA passing through an E-bend consisting of three tandem electrode pairs.

In contrast, FIG. 13B shows a simulated ion beam having an energy of 30 keV and a current of 25 mA passing through an E-bend according to the present teachings, which consists of three electrode pairs 1302, 1304, and 1306, where the inner electrodes of the electrode pairs 1302 and 1306 are maintained at a voltage of −25 kV and the outer electrodes of those electrode pairs are maintained at a voltage of −13.65 kV. The inner electrode of the electrode pair 1304 is grounded and its outer electrode is maintained at a voltage of +16 kV. The simulation results show that the E-bend composed of three separate electrode pairs prevents the blow-up of the beam and allows the beam to traverse the bend and the downstream components without ion loss.

Referring again to FIGS. 11A, 11B, and 11C, in this embodiment, the electrode 218a includes an inner electrode portion 219 that is disposed downstream of the inner electrode 218b and is electrically isolated therefrom (e.g., via a gap). In this embodiment, the electrode portion 219 is coupled at its top and bottom ends to the outer electrode portion of the electrode 218a so as to form a complete rectangular exit electrode that defines a substantially uniform electric potential around the perimeter of the ribbon beam at the exit of the E-bend for maintaining the ribbon shape of the beam. The ion implantation system 1100 further includes another optional corrector device 220 that is disposed downstream of the electrostatic bend for adjusting the current density of the ion beam along its longitudinal dimension (in the non-dispersive plane). Another focusing element 222 is optionally disposed downstream of the second corrector device. The ion implantation system further includes opposed grounded electrode portions 224a and 224b that form an electrically grounded duct through which the ion beam enters an end station 226 in which a wafer 228 is held for exposure to the ion beam.

The use of an E-bend composed of three separate electrode pairs is not limited to ion implantation systems in which a ribbon beam is employed. Rather, such an E-bend can also be utilized downstream of a deceleration system in other ion implantation systems, such as those that employ a circular beam. Another aspect of the present teachings relate to the use of a split lens as an exit lens disposed downstream of an electrostatic bend of the ion implantation system.

Figure 14A:
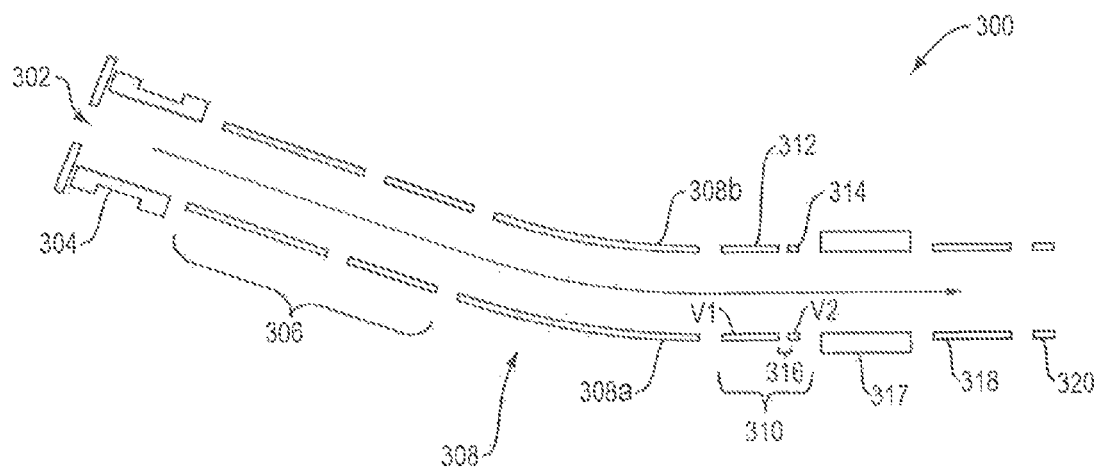
FIG. 14A is a partial schematic cross-sectional view in dispersive plane of an ion implantation system having a split lens disposed downstream of an E-bend.
Figure 14B:
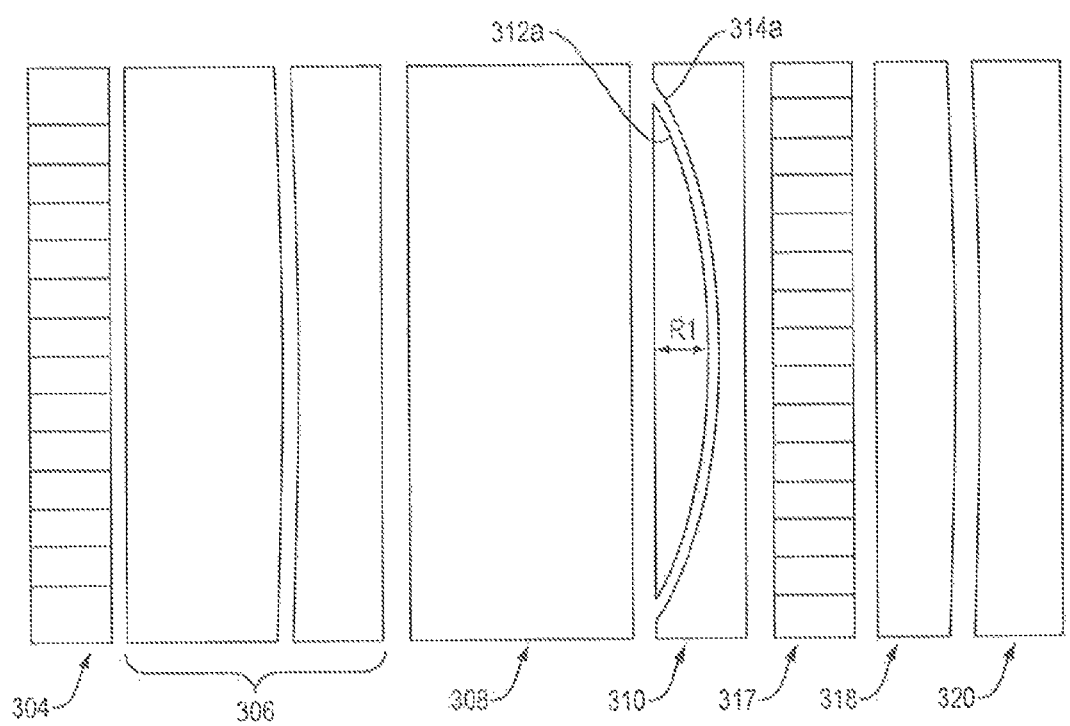
FIG. 14B is a partial schematic side view in non-dispersive plane of the ion implantation system depicted in FIG. 14A.

For example, FIGS. 14A and 14B are partial schematic views of such an implantation system 300, which similar to the implantation system 10 discussed above includes an aperture 302 for receiving a mass-selected ion beam from an upstream mass analyzer (not shown). The ion implantation system 300 further includes a corrector device 304, an acceleration/deceleration system 306 disposed downstream of the corrector device 304 and an electrostatic bend 308 that is disposed downstream of the acceleration/deceleration system. In this embodiment, the electrostatic bend includes a curved outer electrode 308a and a curved inner electrode 308b, where application of a voltage difference between these electrodes results in generation of an electric field in a space therebetween for bending an ion beam passing between the electrodes.

Unlike the above ion implantation system 10, in this embodiment, a split lens 310 is disposed downstream of the electrostatic bend 308. The split lens 310 includes a pair of electrodes 312 and another pair of electrodes 314, where the electrode pair 312 includes a curved downstream end face 312a and the electrode pair 314 includes a curved upstream end face 314a. The two curved end faces of the electrode pairs are separated from one another by a curved gap 316 therebetween. In some implementations, each of the curved end faces of the lenses 312 and 314 is characterized by a radius of curvature (e.g., R1 shown for electrode pair 312) in a range of about 250 mm to about 1000 mm.

The electrode pairs 312 and 314 can be independently biased to different electrical potentials. For example, an electrical potential $V_1$ can be applied to the electrode pair 312 and another electrical potential $V_2$ can be applied to the electrode pair 314. If $V_1$ and $V_2$ are selected such that $V_1 > V_2$, a strong vertically de-focusing lens can be formed. On the other hand, if $V_1 < V_2$, a strong vertically focusing lens can be formed. By way of example, the electrical potential $V_1$ and $V_2$ can be in a range of about 0 V to about −20 kV. In some implementations, $V_1$ and $V_2$ can be chosen to be close to ground potential (e.g., in a range of about 0 V to about −5 kV) even though the electrodes of the electrostatic bend are maintained at higher potentials. This can help lower, and preferably eliminate, energy contamination when operating the ion implantation system in the deceleration mode.

More specifically, in some cases when a conventional lens, rather than the split lens, is employed downstream of the E-bend, the application of high voltages to the lens' electrodes may be needed in order to provide vertical focusing of high energy ion beams (e.g., ion beams having energies in a range of about 30 keV to 60 keV). Such high voltages can result in a temporary increase of the beam's energy as it passes through the lens, which can in turn lead to certain ions undergoing a charge exchange reaction while traversing the lens. Such a charge exchange reaction can result in the formation of neutral atoms/molecules that can be implanted in a downstream wafer as the lens is typically disposed in the direct line of sight relative to the wafer. Moreover, the application of high voltages to the lens' electrodes can result in arcing, which can cause transient instability in the beam.

A split lens such as the above lens 310 can improve the vertical focusing capability of the E-bend while reducing, and preferably eliminating, beam instability due to arcing as well as beam contamination due to generation of neutral atoms/molecules. For example, the radius of curvature of the end faces of the split lens' electrodes can be sufficiently small (e.g., in a range of about 250 mm to about 500 mm depending on the beam height, for example, for a 300 mm tall beam, the radius of curvature can be about 450 mm) to allow for focusing/de-focusing of an ion beam vertically at much lower lens voltages. By way of example, for a 60 keV beam, $V_1$ can be about −10 kV and $V_2$ can be 0 V, much lower than the voltages that would be required to achieve similar focusing effect in a system using a conventional lens.

With continued reference to FIGS. 14A and 14B, a corrector device 317 is optionally disposed downstream of the split lens 310 for adjusting the current density of ion beam along its longitudinal dimension (in the non-dispersive plane). Another focusing element 318 is optionally disposed downstream of the second corrector device. The ion implantation system further includes a grounded electrode 320 that forms an electrically grounded duct through which the ion beam enters an end station (not shown) in which a wafer (not shown) is held for exposure to the ion beam.

Another advantage of using the split lens 310 is that it allows space charge neutralization to occur immediately after the corrector device 317. In contrast, in a system in which a conventional lens, such as lens 318, rather than the split lens 310 is used, the beginning of space charge neutralized beam transport may be moved deep into the grounded duct electrode 320, which may result in the beam blow-up at high currents.

Figure 15:
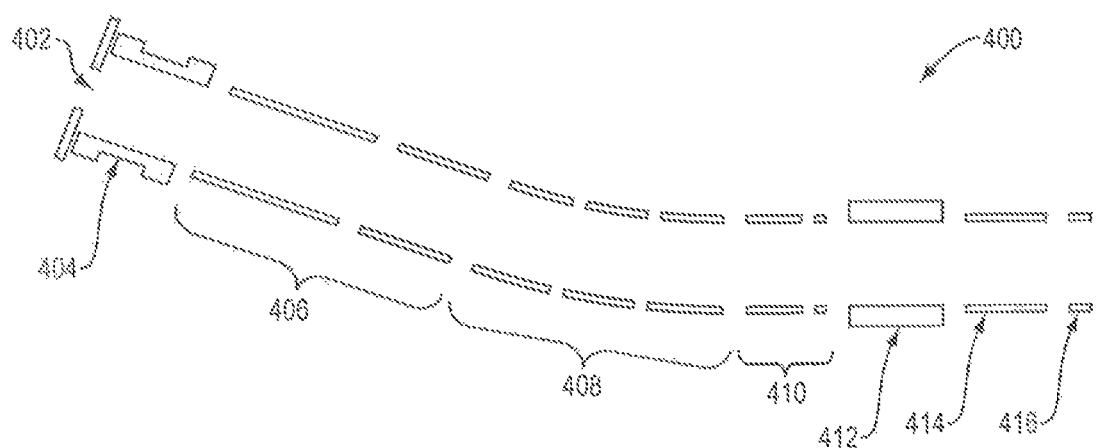
FIG. 15 is a partial schematic view in dispersive plane of an ion implantation system employing an E-bend composed of three electrode pairs as well as a split lens disposed downstream of the E-bend.

A split lens according to the present teachings, such as the above split lens 310, can also be employed downstream of an E-bend comprising three electrode pairs, such as E-bend 212 discussed above. By way of example, FIG. 15 shows a partial schematic view of such an ion implantation system 400, which includes a slit 402 for receiving an ion beam, a corrector device 404, an acceleration/deceleration system 406, an E-bend 408 composed of three separate electrode pairs, a split lens 410, another corrector device 412, a focusing electrode 414 and a grounded electrode 416 providing a duct for entrance of the beam into an end station in which a wafer is disposed. The voltages applied to the electrodes of the E-bend 408 can be in the ranges discussed above in connection with the E-bend 212.

Those having ordinary skill in the art will appreciate that various changes can be made to the above embodiments without departing from the scope of the invention.

What is claimed is:

1. An ion implantation system, comprising:
   a deceleration system configured to receive an ion beam and decelerate the ion beam at a deceleration ratio of at least 2,
   an electrostatic bend disposed downstream of said deceleration system for causing a deflection of the ion beam, said electrostatic bend comprising:
   a first electrode pair disposed downstream of the deceleration system for receiving said decelerated beam, said first electrode pair having an inner and an outer electrode spaced apart to allow passage of the ion beam therebetween,
   a second electrode pair disposed downstream of said first electrode pair and having an inner and an outer electrode spaced apart to allow the passage of the ion beam therebetween, and
   an end electrode pair disposed downstream of said first electrode pair and having an inner and an outer electrode spaced apart to allow the passage of the ion beam therebetween,
   wherein said electrode pairs are configured to be independently biased.

2. The ion implantation system of claim 1, wherein each of the electrodes of the end electrode pair is held at an electric potential less than an electric potential at which any of the electrodes of the second electrode pair is held and the electrodes of the first electrode pair are held at a lower electric potential relative to the electrodes of the second electrode pair.

3. The ion implantation system of claim 1, wherein said deceleration ratio is in a range of about 5 to about 100.

4. The ion implantation system of claim 2, wherein an inner electrode of each of said electrode pairs is held at an electric potential less than an electric potential at which a respective outer electrode of that electrode pair is held.

5. The ion implantation system of claim 2, wherein the outer electrodes of the first and the end electrode pairs are held at a first electric potential ($V_1$) and the inner electrodes of the first and the end electrode pairs are held at a second electric potential ($V_2$).

6. The ion implantation system of claim 5, wherein the inner electrode of the second electrode pair is electrically grounded and the outer electrode of the second electrode pair is held at a third electric potential ($V_3$).

7. The ion implantation system of claim 5, wherein $V_1$ is more positive than $V_2$.

8. The ion implantation system of claim 1, wherein said deceleration system comprises a deceleration element separated from a downstream focusing element such that a gap is defined therebetween.

9. The ion implantation system of claim 1, further comprising an ion source for generating the ion beam.

10. The ion implantation system of claim 9, further comprising an analyzer magnet disposed downstream of the ion source and upstream of the deceleration system for receiving the ion beam generated by the ion source and generating a mass-selected ion beam.

11. The ion implantation system of claim 1, further comprising a split lens disposed downstream of said electrostatic bend, said split lens comprising
   a first electrode pair having a curved downstream end face,
   a second electrode pair having a curved upstream end face,
   wherein said end faces of the two electrode pairs are separated from one another to form a gap therebetween.

12. The ion implantation system of claim 11, wherein said first and second electrode pairs of the split lens are configured to be independently biased.

13. The ion implantation system of claim 12, wherein said first and second electrode pairs of the split lens are biased so as to generate an electric field in said gap for focusing the ion beam passing through the split lens.

14. An ion implantation system, comprising
an electrostatic bend for causing deflection of an ion beam,
said electrostatic bend comprising:
a first electrode pair having an inner and outer electrode spaced apart to allow passage of an ion beam therebetween,
a second electrode pair disposed downstream of said first electrode pair and having an inner and an outer electrode spaced apart to allow passage of the ion beam therebetween, and
an end electrode pair disposed downstream of said second electrode pair and having an inner and outer electrode spaced apart to allow passage of the ion beam therebetween,
wherein each of the electrodes of the end electrode pair is held at an electric potential less than an electric potential at which any of the electrodes of the second electrode pair is held and the electrodes of the first electrode pair are held at a lower electric potential relative to the electrodes of the second electrode pair, and wherein an inner electrode of each of said electrode pairs is held at an electric potential less than an electric potential at which a respective outer electrode of that electrode pair is held.

15. The ion implantation system of claim 14, wherein the outer electrodes of the first and the end electrode pairs are held at a first electric potential ($V_1$) and the inner electrodes of the first and the end electrode pairs are held at a second electric potential ($V_2$).

16. The ion implantation system of claim 15, wherein the inner electrode of the second electrode pair is electrically grounded and the outer electrode of the second electrode pair is held at a third electric potential ($V_3$).

17. The ion implantation system of claim 16, wherein $V_1$ is more positive than $V_2$.

18. An ion implantation system, comprising
an electrostatic bend for receiving an ion beam and causing a deflection thereof,
a split lens disposed downstream of said electrostatic bend,
said split lens comprising:
a first electrode pair having a curved downstream end face,
a second electrode pair having a curved upstream end face,
wherein said first and second electrode pairs are configured to be independently biased and said end faces of the two electrode pairs are separated from one another to form a gap therebetween.

19. The ion implantation system of claim 18, wherein said first and second electrode pairs are biased so as to generate an electric field in said gap for focusing the ion beam passing through the split lens.

20. The ion implantation system of claim 18, wherein said electrostatic bend comprises:
a first electrode pair disposed downstream of the deceleration system for receiving said decelerated beam, said first electrode pair having an inner and an outer electrode spaced apart to allow passage of the ion beam therebetween,
a second electrode pair disposed downstream of said first electrode pair and having an inner and an outer electrode spaced apart to allow the passage of the ion beam therebetween, and
an end electrode pair disposed downstream of said first electrode pair and having an inner and an outer electrode spaced apart to allow the passage of the ion beam therebetween,
wherein said electrode pairs are configured to be independently biased.

* * * * *